United States Patent [19]
Tsudaka

[11] Patent Number: 5,991,006
[45] Date of Patent: Nov. 23, 1999

[54] METHOD AND APPARATUS FOR CORRECTING EXPOSURE PATTERNS, AND EXPOSURE MASK, METHOD OF EXPOSING AND SEMICONDUCTOR DEVICE

[75] Inventor: Keisuke Tsudaka, Kanagawa, Japan

[73] Assignee: Sony Corporation, Japan

[21] Appl. No.: 08/957,925

[22] Filed: Oct. 27, 1997

[30] Foreign Application Priority Data

Oct. 29, 1996 [JP] Japan ................................ P08-286213

[51] Int. Cl.⁶ ............................... G03B 27/42; G03F 9/00
[52] U.S. Cl. ................................... 355/53; 430/5
[58] Field of Search ................................ 355/47, 53, 67, 355/77, 403, 404; 430/5, 30, 311

[56] References Cited

U.S. PATENT DOCUMENTS

| | | | |
|---|---|---|---|
| 5,422,491 | 6/1995 | Sakamoto | 250/492.22 |
| 5,561,317 | 10/1996 | Momma et al. | 257/620 |
| 5,667,923 | 9/1997 | Kanata | 430/30 |
| 5,698,346 | 12/1997 | Sugawara | 430/5 |
| 5,700,601 | 12/1997 | Hasegawa et al. | 430/5 |
| 5,792,581 | 8/1998 | Ohnuma | 430/30 |
| 5,825,647 | 10/1998 | Tsudaka | 364/167.03 |

*Primary Examiner*—Safet Metjahic
*Assistant Examiner*—Hung Henry Nguyen
*Attorney, Agent, or Firm*—Ronald P. Kananen; Rader, Fishman & Grauer

[57] ABSTRACT

A method of transforming the exposure pattern is provided so as to obtain a transferred image as being closest possible to the object design pattern in a lithography process. The method includes the steps of dividing a visible outline of desired design pattern P into a plurality of edges according to a specified rule, then assigning a plurality of evaluation points H to each of the edges; computing a transferred image of an exposed pattern by simulation; computing a distance between each evaluation point H on each edge E and a position corresponding to each evaluation point H of the transferred image of the exposed pattern; and determining a corrected exposure pattern by inputting the distance to a specified evaluation function to correct the position of each edge E according to the output value of the evaluation function.

10 Claims, 35 Drawing Sheets

METHOD AND APPARATUS FOR CORRECTING EXPOSURE PATTERNS, AND EXPOSURE MASK, METHOD OF EXPOSING AND SEMICONDUCTOR DEVICE

BACKGROUND OF THE INVENTION

The present invention relates to a method and an apparatus for correcting exposure patterns in a lithography process of semiconductor devices, as well as an exposure mask, a method of exposing, and a semiconductor device.

In a photo-lithography process for the manufacturing of semiconductor devices, an exposure mask provided with a mask pattern corresponding to a desired design pattern is prepared, and a light is exposed on a resist material through this mask to transfer the design pattern.

Recently, there was provided a lithography process executed around the limit of theoretical development corresponding to strictly specified design rules required as semiconductors are finely fragmented more and more. And, this often causes resolution to become insufficient, resulting in occurrence of a problem of difference between the mask pattern and the transferred resist pattern.

Such a phenomenon then causes deterioration of semiconductor device performance due to the transformation of the printed pattern, as well as a drop of production yield due to pattern bridging and wire breaking. To avoid such problems, therefore, the object mask pattern is optimized with the cut & try treatment to obtain a desired resist pattern.

There is also provided a treatment for optimizing a mask pattern such way; a plurality of qualification patterns are added to the object design pattern to correct the mask pattern, then a transferred pattern is determined by a printing test or simulation and obtain qualification patterns so as to find a transferred pattern closest to the desired design pattern.

However, it takes too much time and too many processes to determine an optimized mask pattern with the cut & try treatment. This method can therefore apply only to some patterns. The method cannot apply to such irregular patterns as an ASIC. In addition, the number of mask patterns that can be evaluated with the cut & try treatment is also limited, so that the optimized mask pattern might be overlooked.

To solve such problems and let each mask pattern be optimized by a computer automatically, a photo-proximity effect correction technology has been developed. In a mask pattern correction by this technology, the following processings are executed to correct the object mask pattern for the inputted design pattern.

(1) The visible outline of the inputted design pattern is divided into edges.

(2) An evaluation point is assigned to the center of each of the edges.

(3) The transferred image at the evaluation point is found, as well as the offset between this evaluation position and the position corresponding to the transferred image evaluation point is found. Otherwise, the offset of the energy intensity at the evaluation point from the desired value is found.

(4) Each edge is moved to a position so that the offset of the transferred image at the evaluation point becomes 0.

The above processings (3) and (4) are repeated by the computer to find the optimized mask pattern.

Correction of a mask pattern with such automatic photo-proximity effect correction technology will result in the following problems, however. As the offset (error) at the evaluation point is minimized, the error grows at portions to which no evaluation point is added, so that the offset of the mask pattern is also enlarged as a whole.

FIG. 1 shows an example of mask pattern correction in the related art. When an attempt is made to minimize the offset at the evaluation point shown with an x mark in the figure, part of the transferred image I formed using the corrected mask pattern is expanded significantly from the design pattern P depending on the shape of the design pattern P.

To avoid this problem, a method was considered for reducing the pitch between evaluation points by increasing the number of divisions for the design pattern P. This method, however, causes the mask pattern to be complicated after correction, so that the method makes it difficult to manufacture the object semiconductor device, as well as to increase the cost of the mask. In addition, since finely fragmented patterns are generated, it becomes impossible to make fault checks. And, it also becomes impossible to create quality-assured masks sometimes.

In addition, unnecessary steps are also developed in the mask pattern and such differences in level cause the contrast of the transferred image to be lowered. FIG. 2A shows a transferred image I of a design pattern P. FIG. 2B shows a transferred image I obtained by adding a corrected design pattern P' to the design pattern P. Although the same transferred image I is obtained for both design patterns P and P', the contrast of the transferred image I is lowered when the step is expanded by the corrected pattern P' added as shown in FIG. 2B. As a result, the exposure tolerance is lowered. This is another problem to occur in the related art.

SUMMARY OF THE INVENTION

Under such circumstances, it is an object of the present invention to solve above problems. In other words, according to the present invention, the object exposure pattern is transformed so as to obtain a transferred image as being closest possible to the desired design pattern in the lithography process. More specifically, the method comprises the steps of dividing the visible outline of the desired design pattern into edges according to a specified rule, then assigning a plurality of evaluation points to each of the edges; computing a transferred pattern image after the exposure by simulation; computing a distance between each evaluation point or each edge and a position corresponding to each evaluation point of the transferred image of the exposed pattern; and determining a corrected exposure pattern by inputting the distance to a specified evaluation function to correct the position of each edge according to an output value of the evaluation function.

The above method of the present invention further includes the steps of dividing the visible outline of the desired design pattern into edges according to a specified rule, then assigning a plurality of evaluation points to each of the edges; computing a transferred energy intensity of the exposed pattern by simulation; determining a corrected exposure pattern by inputting the transferred energy intensity to a specified evaluation function to correct the position of each edge according to the output value of the evaluation function.

Furthermore, it is another object of the present invention to provide an apparatus for correcting exposure patterns by means of the above correcting method, an exposure mask provided with a mask pattern formed according to the above correcting method, a method of exposing using the above exposure mask, and a semiconductor device manufactured with a lithography process using the above exposure mask.

In the present invention, a plurality of a evaluation points are assigned to each of the edges obtained by dividing the visible outline of the object design pattern and computing the distance between each evaluation point and the position corresponding to each evaluation point on the exposed pattern image, and the distance between each of a plurality of the evaluation points and the exposure image on each edge can be computed. Consequently, it can be judged from those computed values how the exposure image is inclined relative to the object design pattern. In addition, since this distance is inputted to a specified evaluation function to determine the correction value of the exposure pattern, alignment of the exposed image to the design pattern can be optimized.

DESCRIPTION OF THE PREFERRED EMBODIMENTS

Hereunder, an embodiment of the present invention will be explained with reference to the accompanying drawings. In this embodiment, an exposure pattern is transformed so as to be corrected into a transferred image as being closest possible to the desired design pattern. At first, a method of correcting an exposure pattern in this embodiment will be explained briefly. All processing to be described below is executed on such a computer such as a work station.

Figure 1:
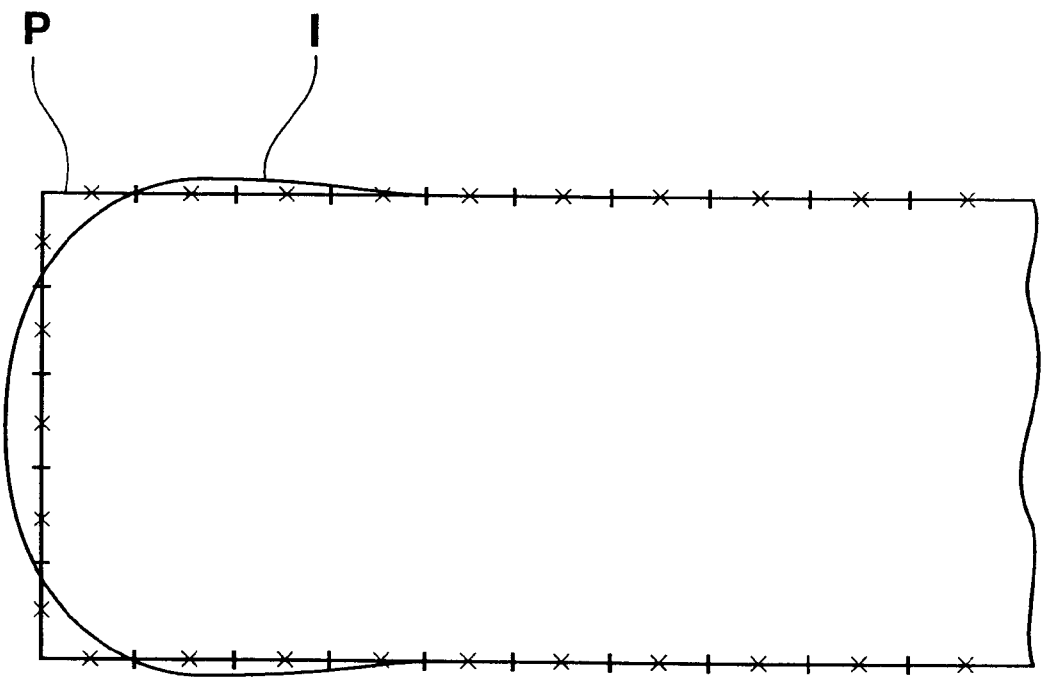
FIG. 1 is an illustration showing an example of a related art exposure pattern correction.
Figure 2A:
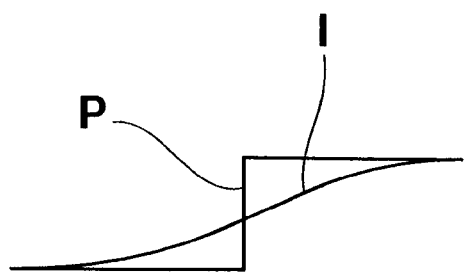
FIG. 2A is an illustration showing an example of a design pattern and a transferred image thereof.
Figure 2B:
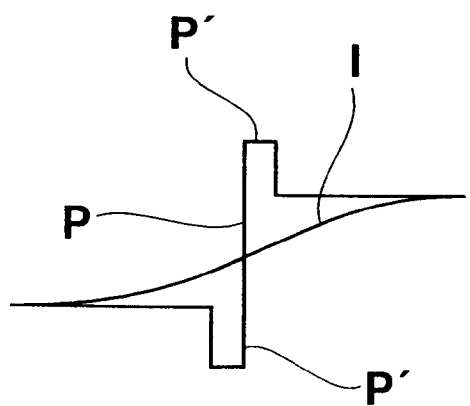
FIG. 2B is an illustration showing an example of a related art correction of the design pattern of FIG. 2A and a transferred image thereof.
Figure 3:
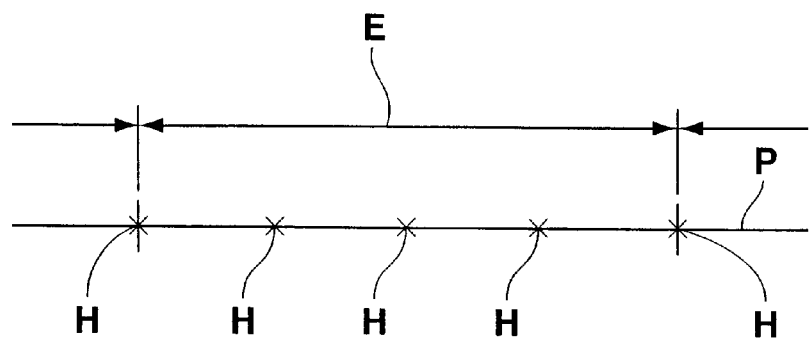
FIG. 3 is an illustration showing edges and evaluation points.

At first, the visible outline (the perimeter edge that defines the outline of the pattern features) of a design pattern P is divided or segmented into edges E as shown in FIG. 3. Then, a plurality of evaluation points H are assigned to each of the edges E. At this time, the pitch between those evaluation points H is minimized to avoid overlooking of errors at portions where no evaluation points are added.

Figure 4A:
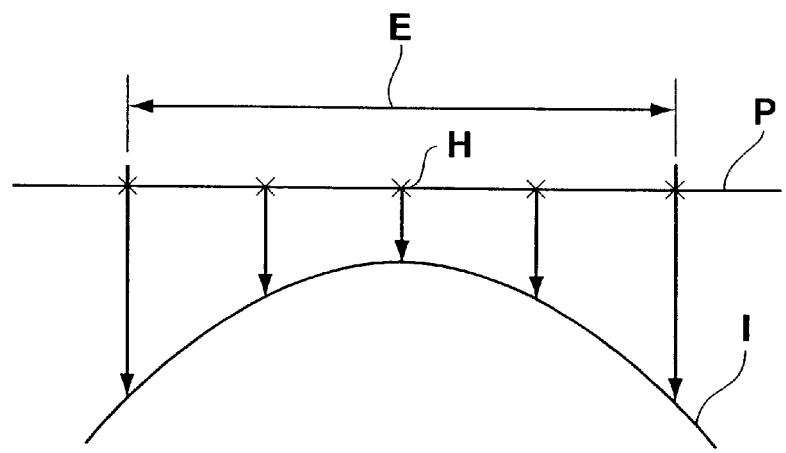
FIG. 4A is an illustration showing computation of distances between the transferred image and the evaluation points in exposure pattern correction with a peak of the image in the center of the edge.

After this, a transferred image I of the exposure pattern is computed by simulation in the current stage as shown in FIG. 4A to compute the distance as shown with an arrow in the figure, that is, the distance (error) between each evaluation point H and the position of the transferred image I corresponding to the evaluation point H.

Figure 4B:
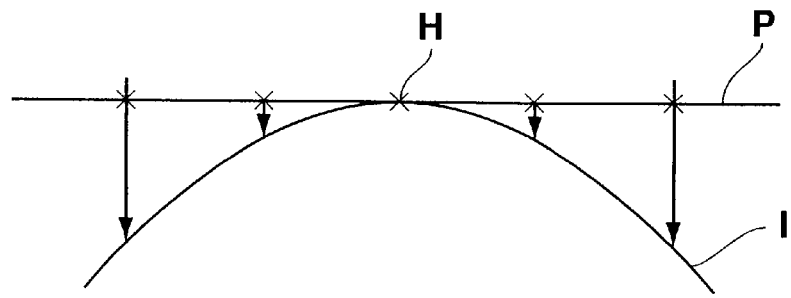
FIG. 4B is an illustration showing the biased transferred image.

Then, when a peak of the transferred image I is found at any evaluation point except for those of both sides of the edge E (when the transferred image I becomes convex or concave), the exposure pattern is corrected (biased) so that this peak point is aligned to that of the design pattern P according to the distance (error) at each evaluation point H. For example, the evaluation point H in the center of the edge E shown in FIG. 4A corresponds to a peak, so the exposure pattern is biased so that the peak of the transferred image I corresponding to this evaluation point H is aligned to that of the design pattern P as shown in FIG. 4B.

In this embodiment, a specified evaluation function is used to compute this bias value, so that the exposure pattern is corrected so as to satisfy the designer's intention.

Figure 5A:
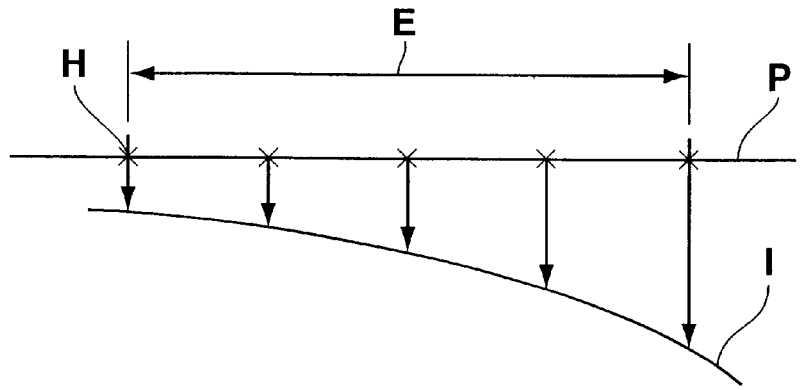
FIG. 5A is an illustration showing computation of the distances in exposure pattern correction with peaks at both ends of the edge.
Figure 5B:
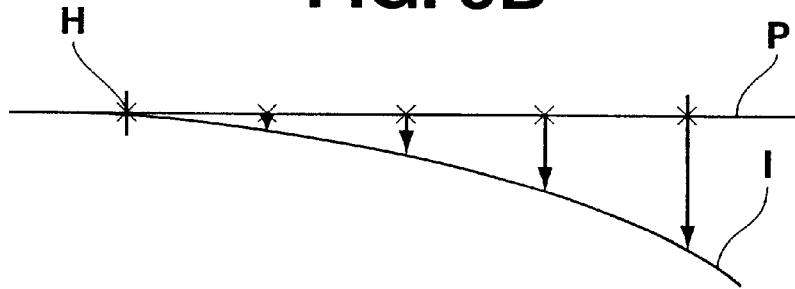
FIG. 5B is an illustration showing the biased transferred image.

When peaks are found at both ends of the edge E (when the transferred image I is neither convex nor concave) in the distance (error) at each evaluation point H, the exposure pattern is biased so that portions almost in parallel to the design pattern P of the transferred image I are aligned to those of the design pattern P. For example, in the example shown in FIG. 5A, the evaluation point H at the left end of the edge E corresponds to a peak point of the transferred image and this portion is almost in parallel to the design pattern P. Consequently, the exposure pattern is biased so that this portion is aligned to that of the design pattern P as shown in FIG. 5B.

This bias value is computed using a specified evaluation function that regards the error at a portion almost in parallel to the design pattern P as important in the transferred image I, so that the exposure pattern is corrected naturally to satisfy the designer's intention.

Figure 6:
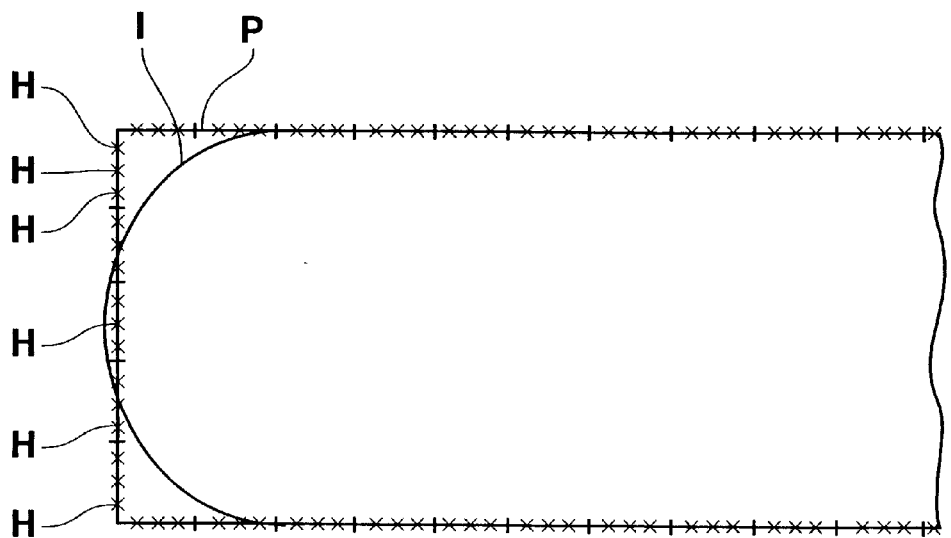
FIG. 6 is an illustration showing an example of a corrected exposure pattern.

FIG. 6 shows such a correction example. The visible outline of a design pattern P is divided into a plurality of edges and a plurality of evaluation points H (x marks in the figure) are assigned to each of the edges such way. And, as described above, each edge is corrected (biased) using the specified evaluation function so that a natural (without being swollen unnecessarily) transferred image I can be obtained as the designer intends. In addition, the line width can also be controlled properly.

Subsequently, the above embodiment will be explained more concretely. FIG. 7 through FIG. 12 are illustrations explaining the first embodiment of the present invention. In the first embodiment, a polysilicon layer of 0.20 $\mu$m rule SRAM is exposed to a light on the conditions (light wave form=248 nm, NA=0.55, and σ=0.60).

Figure 7:
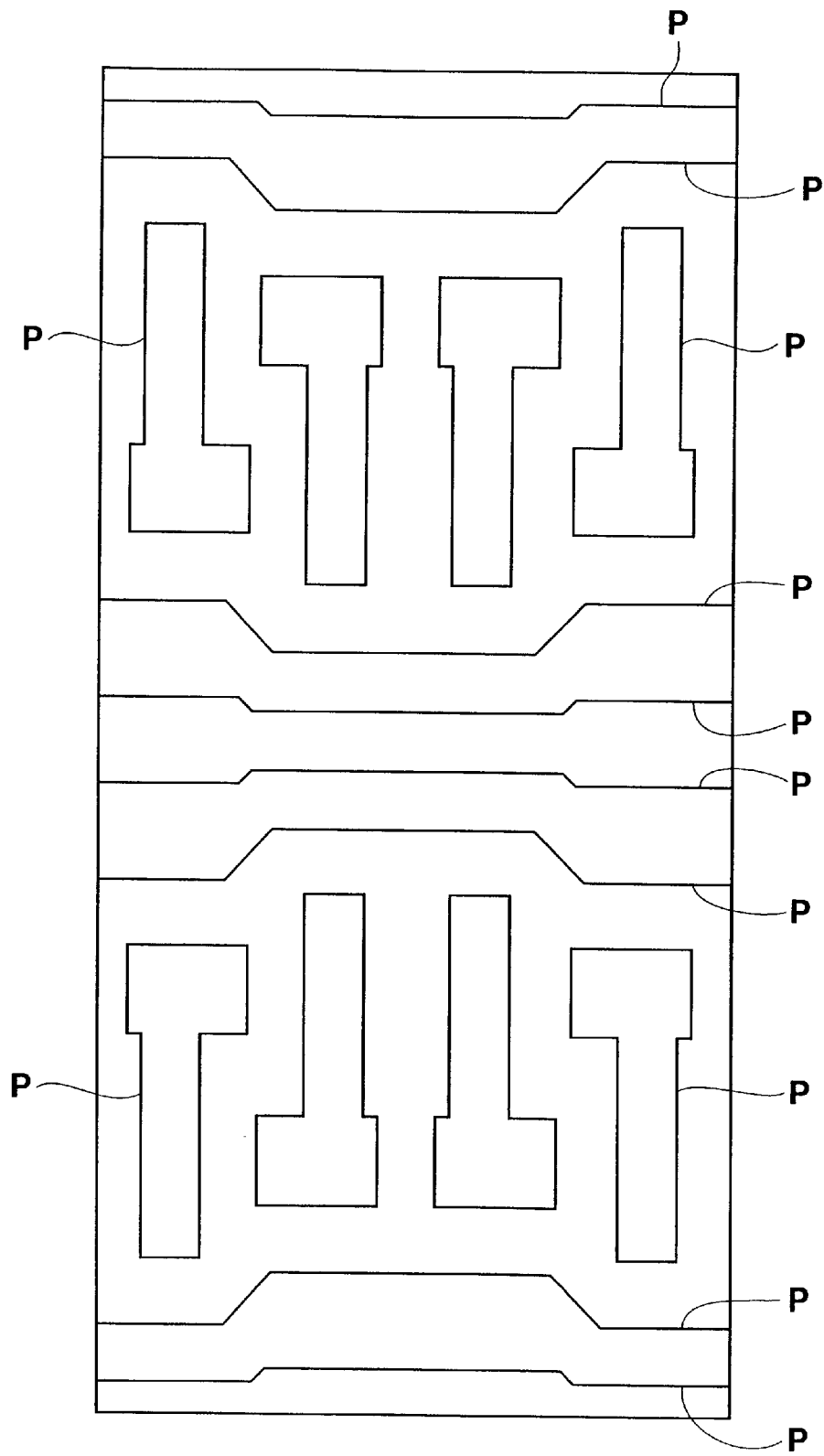
FIG. 7 is an illustration showing a design pattern in the first and fifth embodiments.
Figure 8:
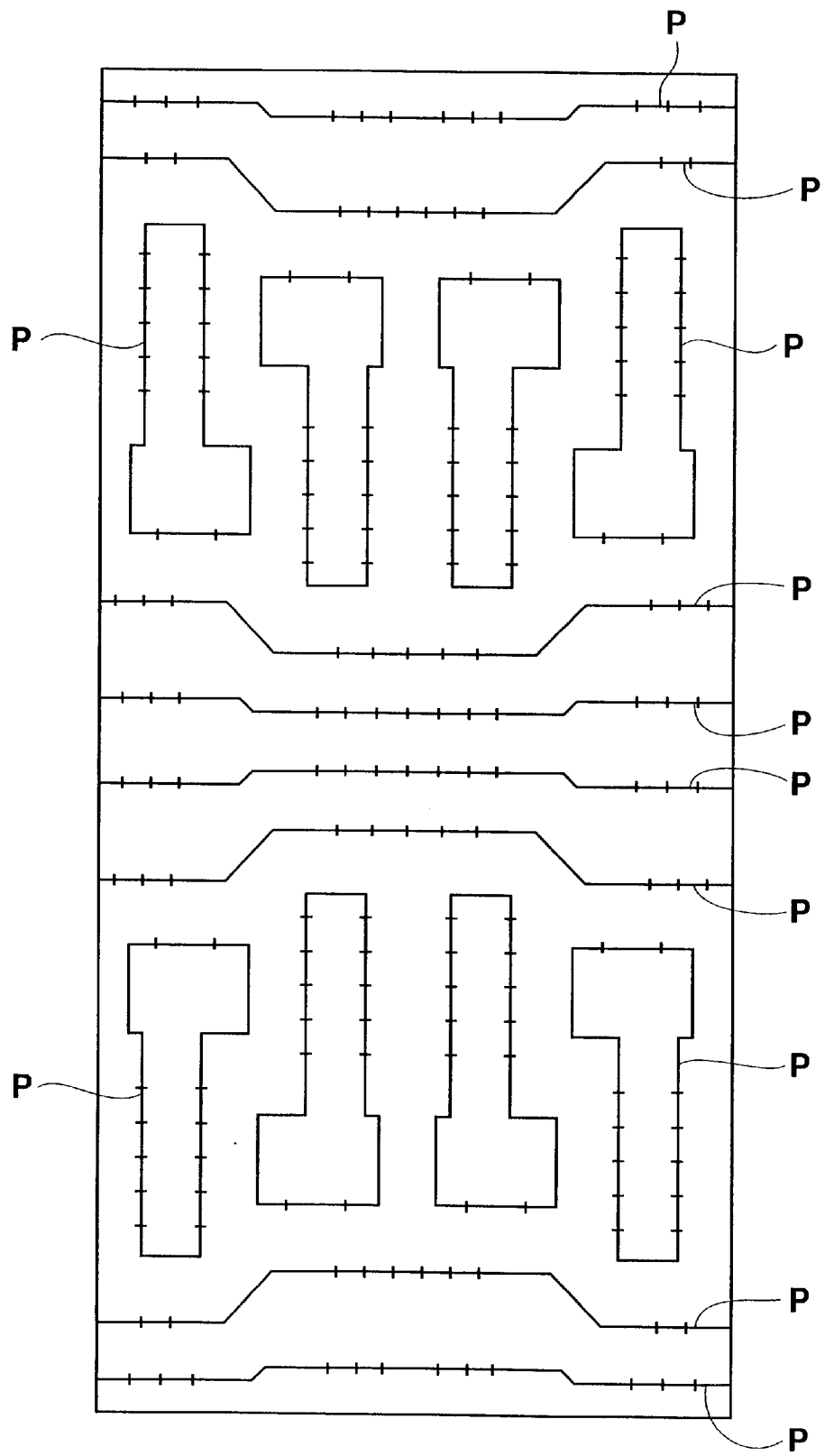
FIG. 8 is an illustration showing division of the design pattern in the first and fifth embodiments.
Figure 9:
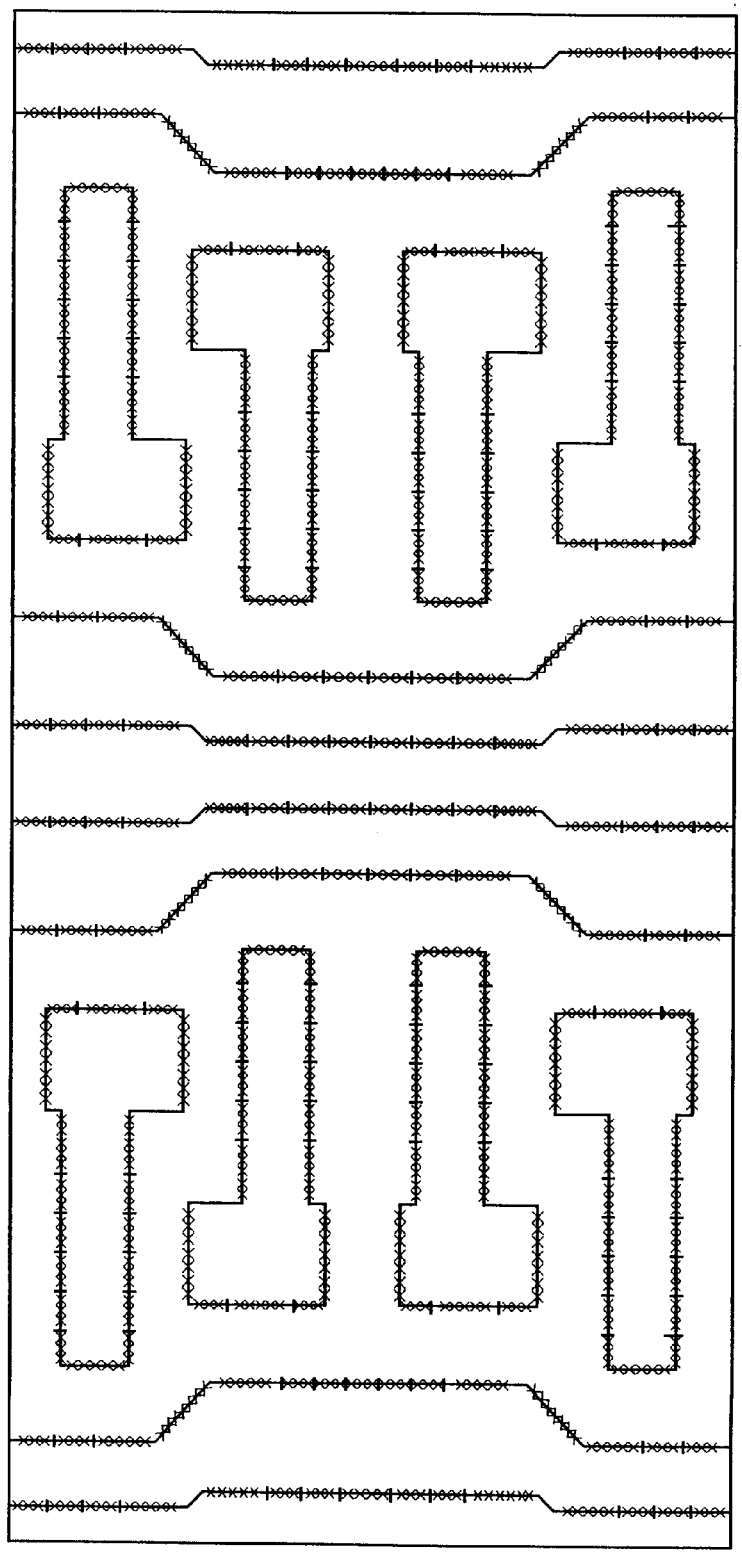
FIG. 9 is an illustration showing assigned evaluation points in the first and fifth embodiments.

FIG. 7 shows a design pattern used in the first embodiment. The object exposure pattern is corrected (biased) so as to obtain a transferred image closest possible to this design pattern P. At first, the visible outline of the design pattern P is divided at specified pitches as shown in FIG. 8 to form a plurality of edges. Furthermore, as shown in FIG. 9, a plurality of evaluation points (x marks) are assigned to each of the edges.

Figure 10:
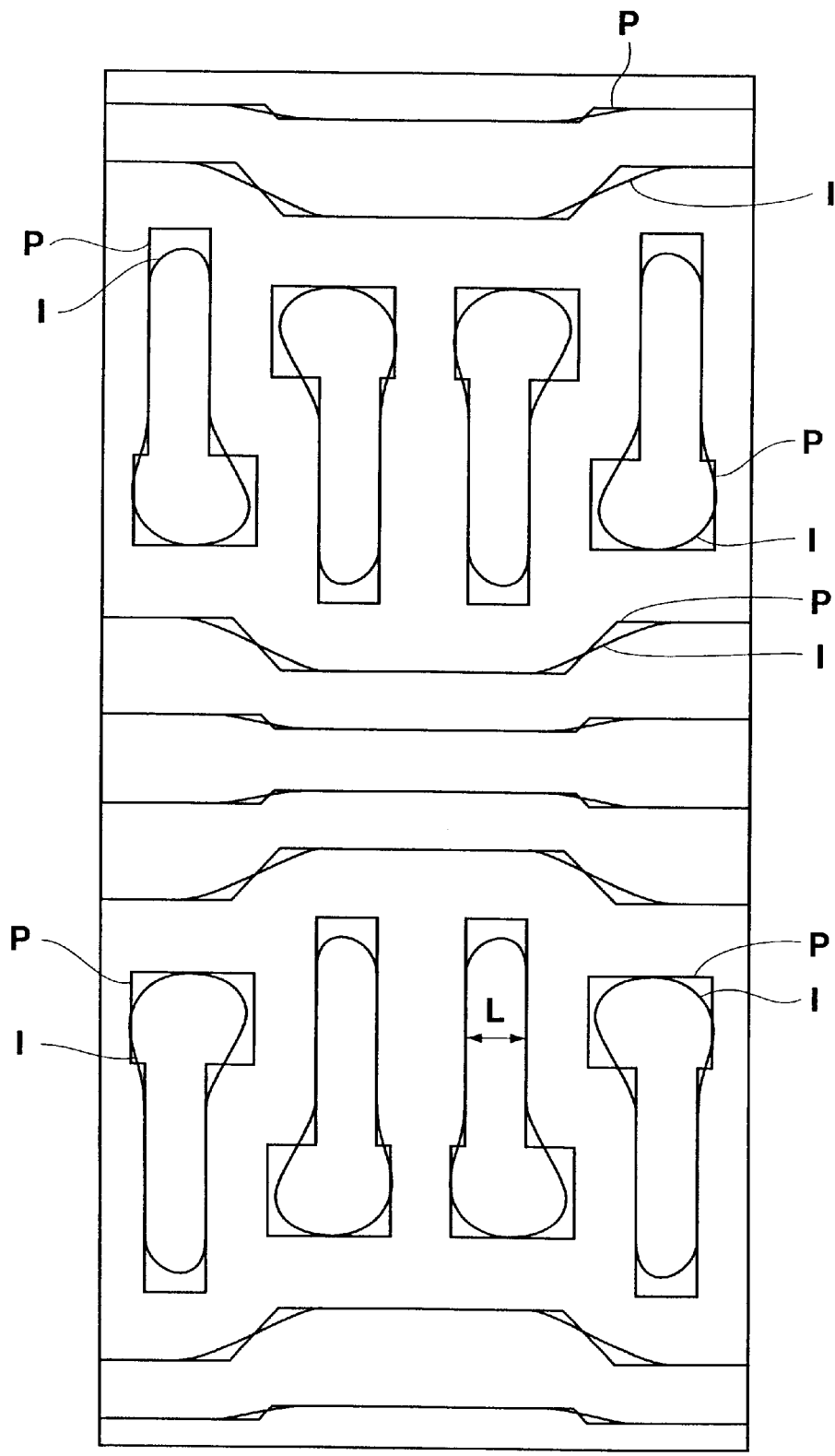
FIG. 10 is an illustration showing a transferred image due to the design pattern of FIG. 8 in the first and fifth embodiments.

After this, a light intensity distribution when this design pattern P is transferred just in focus by using a mask with this very design pattern is obtained, then a contour line for which the light intensity distribution is sliced with a specified threshold value is found as a transferred image. FIG. 10 shows this transferred image I put on the design pattern P.

Subsequently, at each evaluation point assigned to each edge is found the offset from the position corresponding to each evaluation point of the transferred image I and the inclination of the transferred image I at the position corresponding to each evaluation point. At this time, the direction for measuring the offset value of the transferred image I is defined to be vertical to the linear direction of the design pattern P and the direction outward from the design pattern P is defined to be forward.

In this case, the offset obtained in correspondence to each evaluation point is defined as E and the inclination of the transferred image I corresponding to each evaluation point is defined as S.

After this, the obtained offset E and the inclination S are substituted for the following expression to calculate the correction value (bias value B) of each of the edges obtained by the above division. This bias value B is a correction pattern value added to the exposure pattern.

$$B = -0.5 \cdot \Sigma(Ei/Si^2)/\Sigma(1/Si^2)$$

In the above expression, Ei indicates the offset value at the i-th evaluation point of an edge and Si indicates the inclination at the i-th evaluation point of an edge.

This expression is used when peaks are found in the offset corresponding to the evaluation points at both ends of an edge and set so as to strengthen the influence on the bias B as the inclination corresponding to each evaluation point is smaller (almost in parallel to the design pattern P). When the power multiplier for the inclination S in this expression is greater, this influence can be more increased. On the contrary, when the power multiplier is smaller, this influence can be reduced.

In this expression, −0.5 is a specified constant and "−" means that biasing is executed in the opposite direction of the offset. "0.5" is a coefficient for adjusting the bias to be executed at one calculation.

On the other hand, when an offset peak is found at any evaluation point other than those at both ends of an edge, the following expression is used to calculate the bias value.

$$B = -0.5 \cdot Ep$$

In this expression, Ep indicates the offset value at the evaluation point corresponding to the peak.

In this expression, when an offset peak is found at any evaluation point other than those at both ends of an edge, a bias value B is found so that the transferred image I can be aligned to that of the design pattern P at the evaluation point corresponding to the peak.

After a bias value B is found by the above expression according to the inclination of the transferred image I at each edge, the exposure pattern corresponding to each edge is moved by the bias value to obtain a corrected exposure pattern. After this corrected exposure pattern is obtained, the same computation is repeated to obtain the optimized exposure pattern while each evaluation point is kept as it is.

Figure 11:
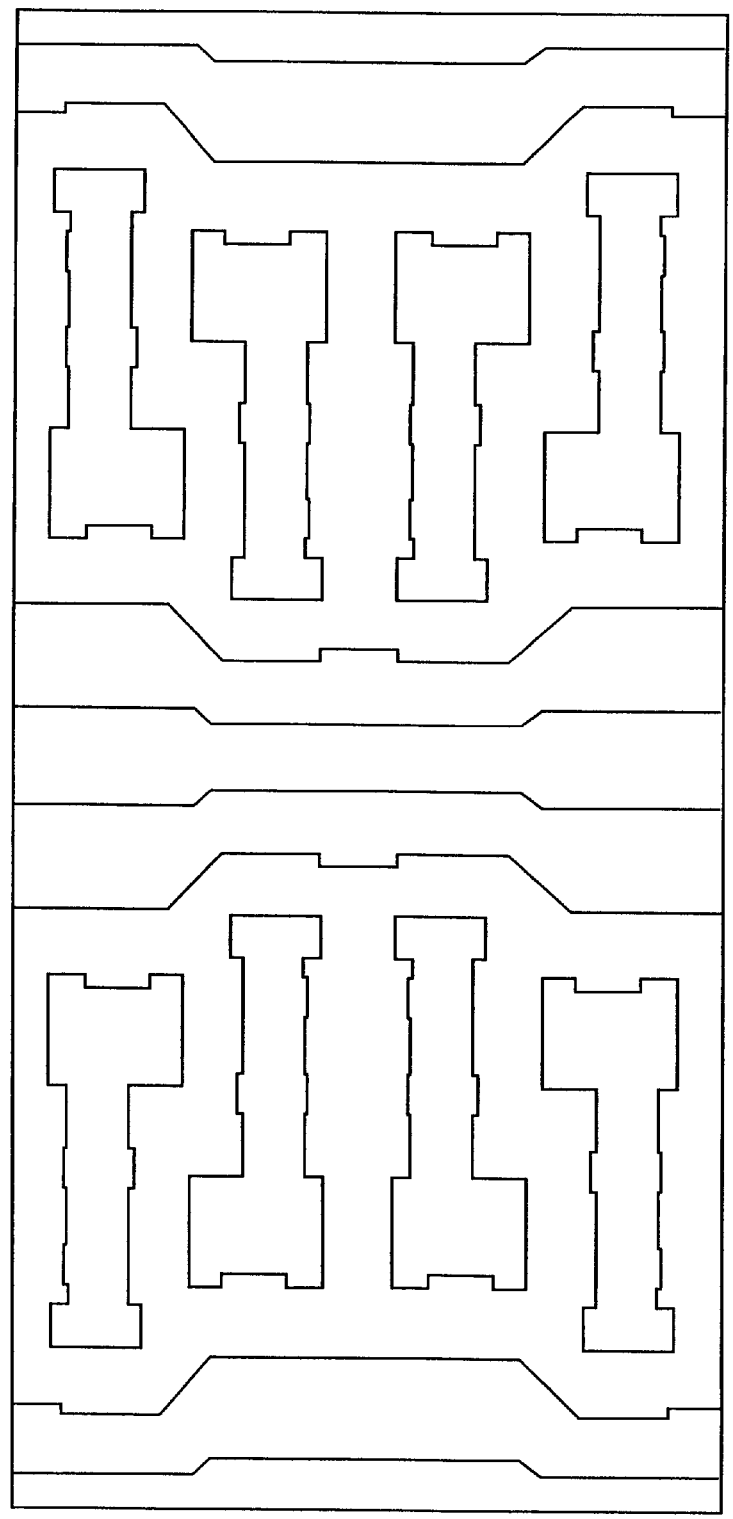
FIG. 11 is an illustration showing a corrected exposure pattern in the first and fifth embodiments.
Figure 12:
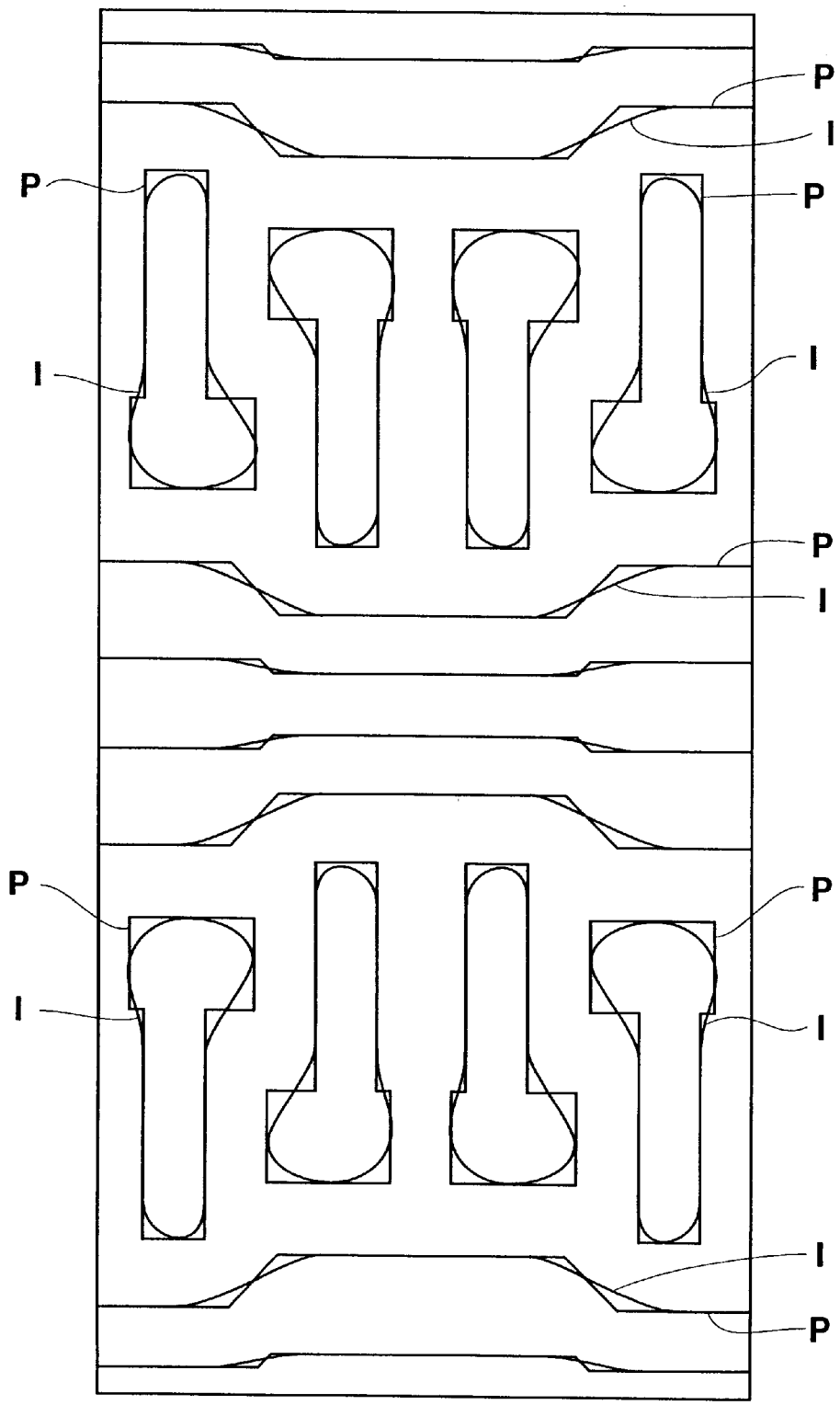
FIG. 12 is an illustration showing a transferred image by the corrected exposure pattern of FIG. 11 in the first and fifth embodiments.

FIG. 11 shows an exposure pattern corrected by such a computation. This corrected exposure pattern is then used as a mask pattern to form another exposure mask, so that the transferred image I as shown in FIG. 12 is formed with the new exposure pattern. With such a correction, the shrinkage of the line end in the design pattern P is reduced more significantly than that of the transferred image I before correction as shown in FIG. 10, so that controlling of the line width is also improved.

In addition, the shrinkage of the region where a contact hole is formed is also suppressed, as well as the superposition tolerance is improved. By correcting the exposure pattern to form an exposure mask as described above, the exposure pattern can be formed as the designer intends and the use of this exposure mask enables semiconductor devices with excellent in electrical properties to be manufactured more effectively.

Figure 13:
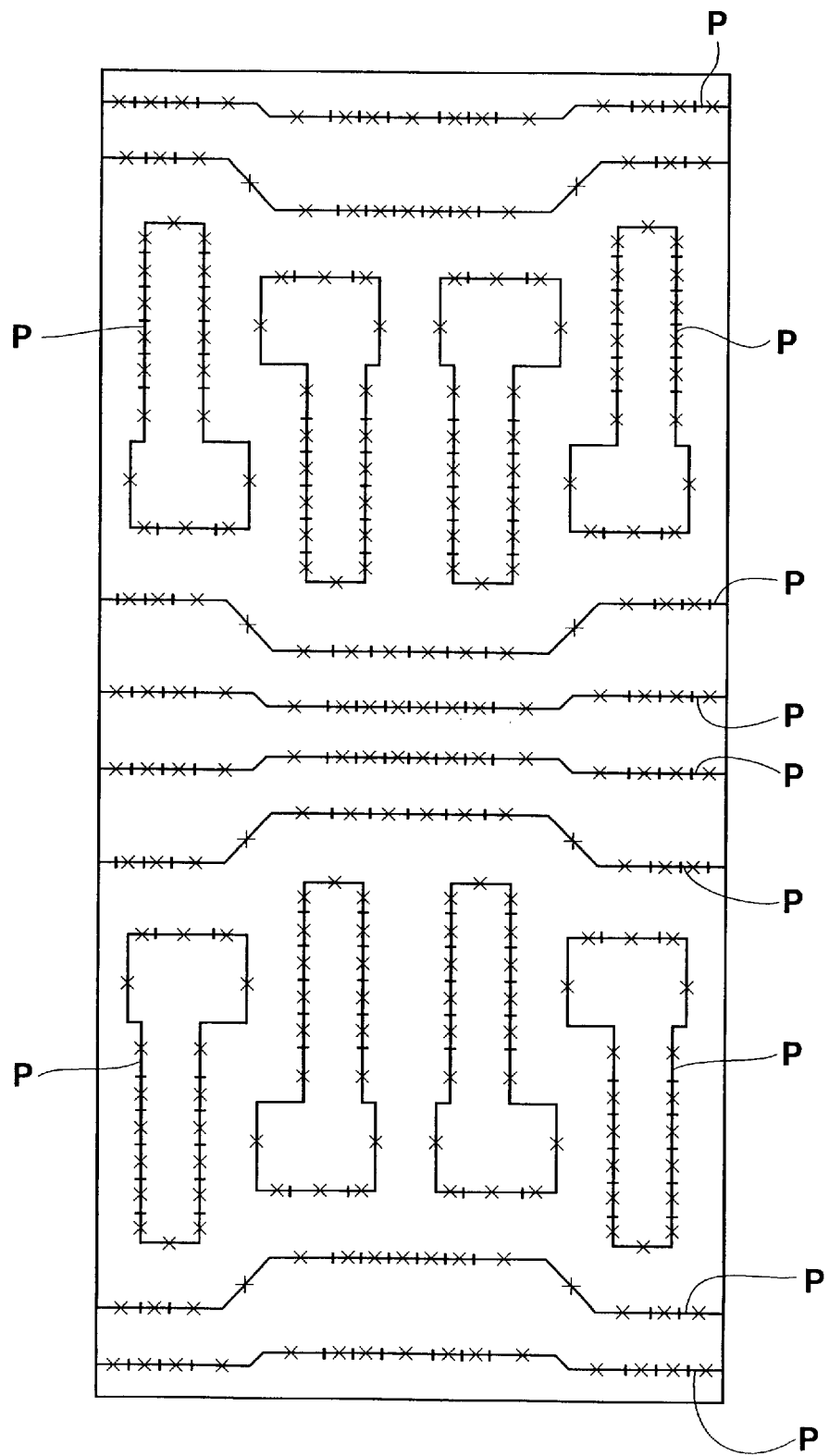
FIG. 13 is an illustration showing division of the design pattern and assignment of evaluation points in an example for the first comparison.
Figure 14:
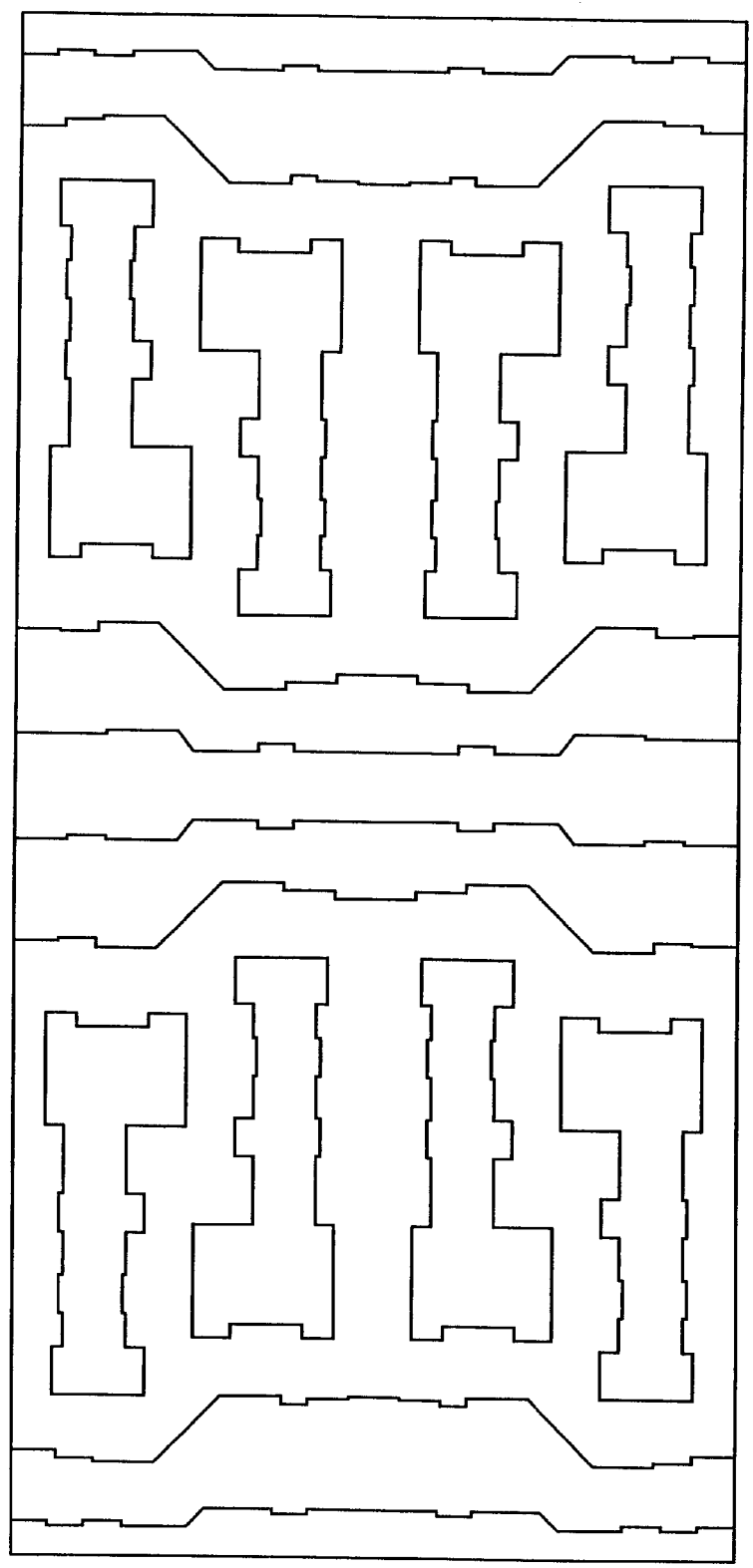
FIG. 14 is an illustration showing a corrected exposure pattern in the example for the first comparison.
Figure 15:
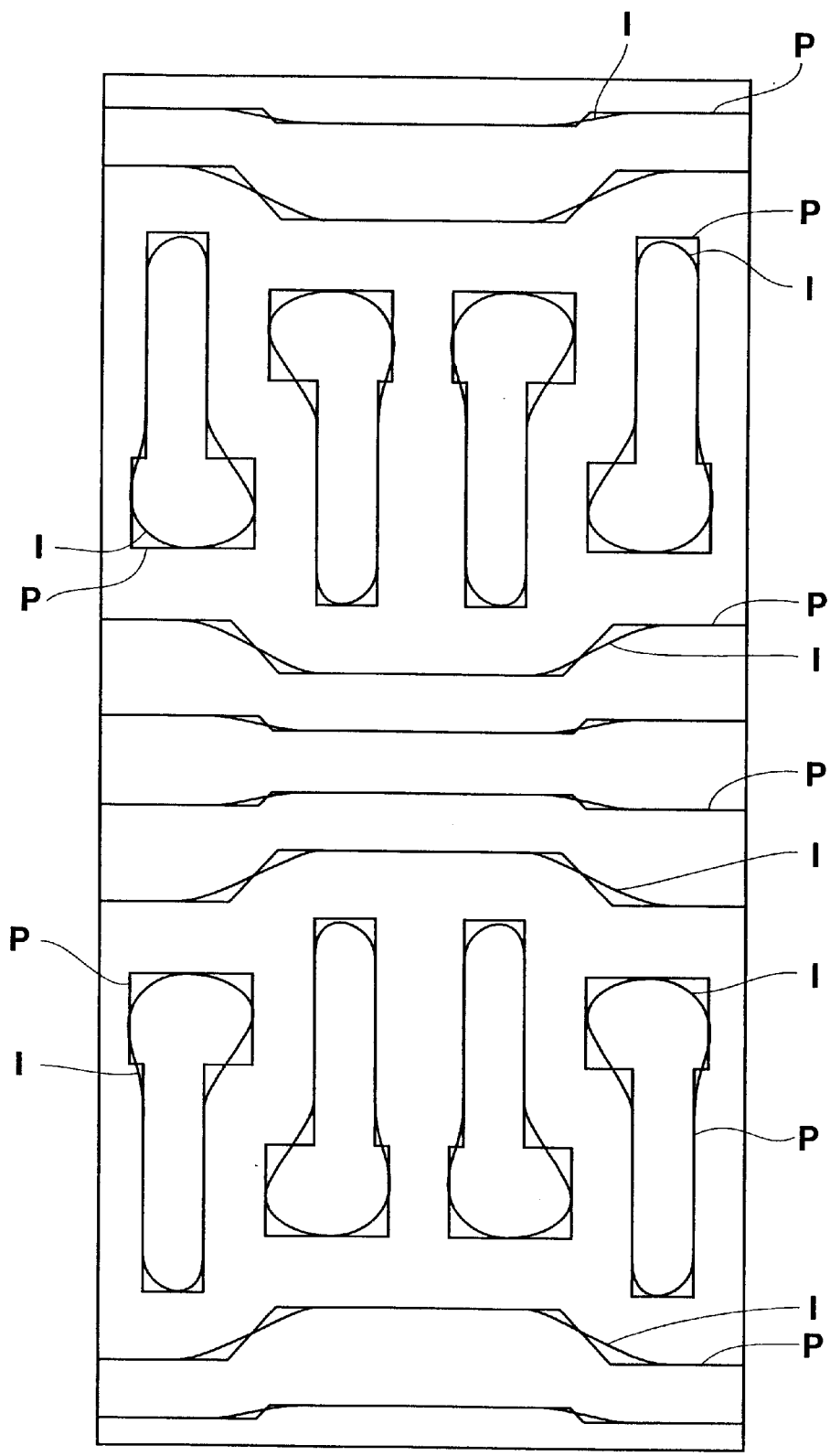
FIG. 15 is an illustration showing a transferred image by the corrected exposure pattern of FIG. 14 in the example for the first comparison.

Hereunder, correction results will be compared between a related art embodiment and this embodiment using a design pattern used in the first embodiment. FIG. 13 shows a related art example in which the visible outline of the same design pattern P as that in the first embodiment is divided and one evaluation point (x mark) is assigned to the center of each of the edges. FIG. 14 shows a masking pattern corrected so as to minimize the offset at this evaluation point. FIG. 15 shows a transferred image that uses the masking pattern shown in FIG. 14.

Since only one evaluation point is added to each edge in the related art embodiment, the exposure pattern must be corrected so as to minimize the offset at the evaluation point. Thus, the following expression is used to find the bias value B.

$$B=-0.5 \cdot E$$

E indicates the offset at the evaluation point.

In the related art embodiment, therefore, no offset (error) is considered at the portions to which no evaluation points are assigned. As a result, although the offset is smaller at each evaluation point, the offset of the edge position around the evaluation point is increased as shown in FIG. 15.

On the other hand, when the correcting method in the first embodiment is applied, the transferred image I can be suppressed from an unnecessary offset from the design pattern P as shown in FIG. 12.

Figure 16:
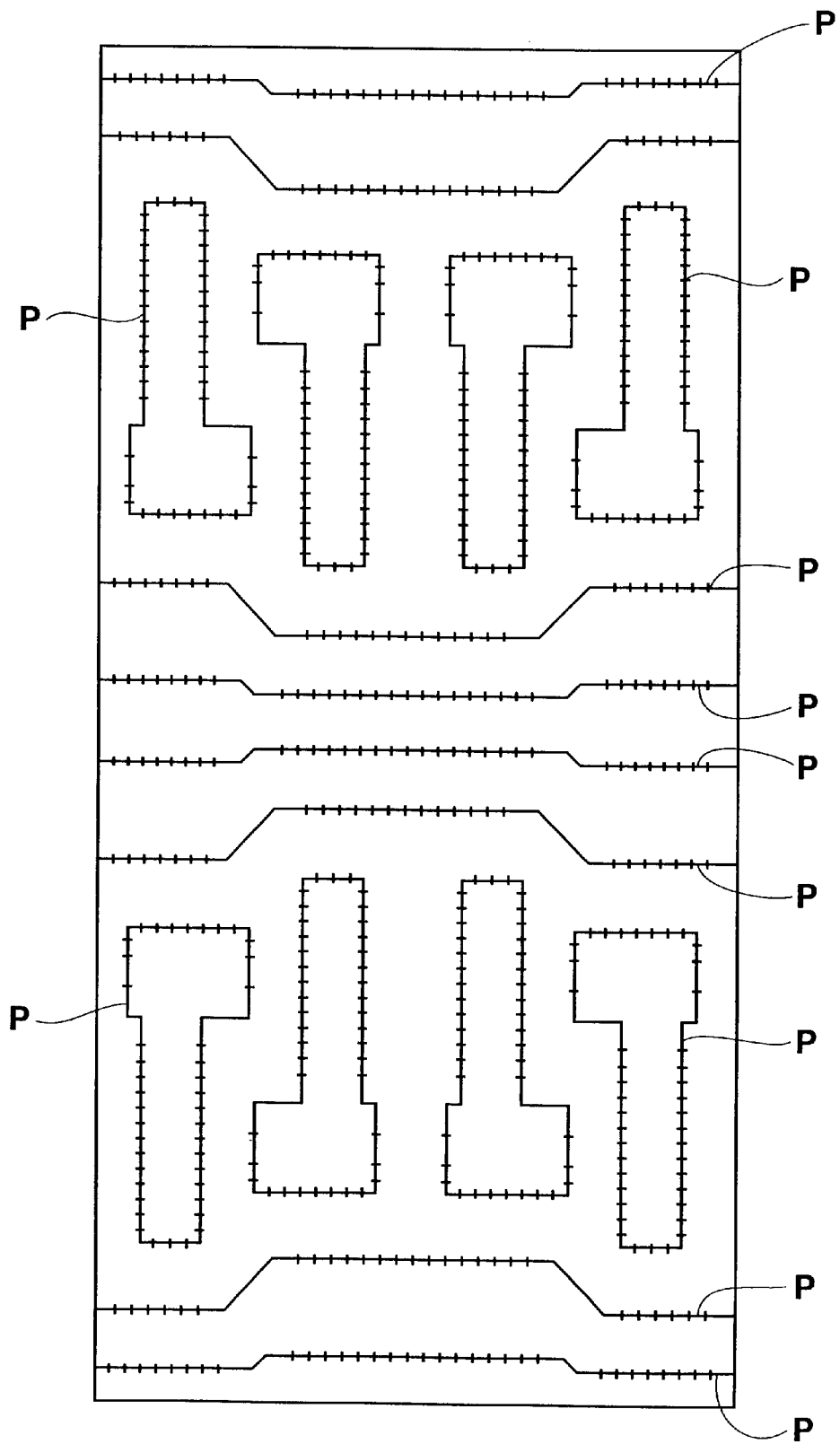
FIG. 16 is an illustration showing division of the design pattern in an example of the second comparison.
Figure 17:
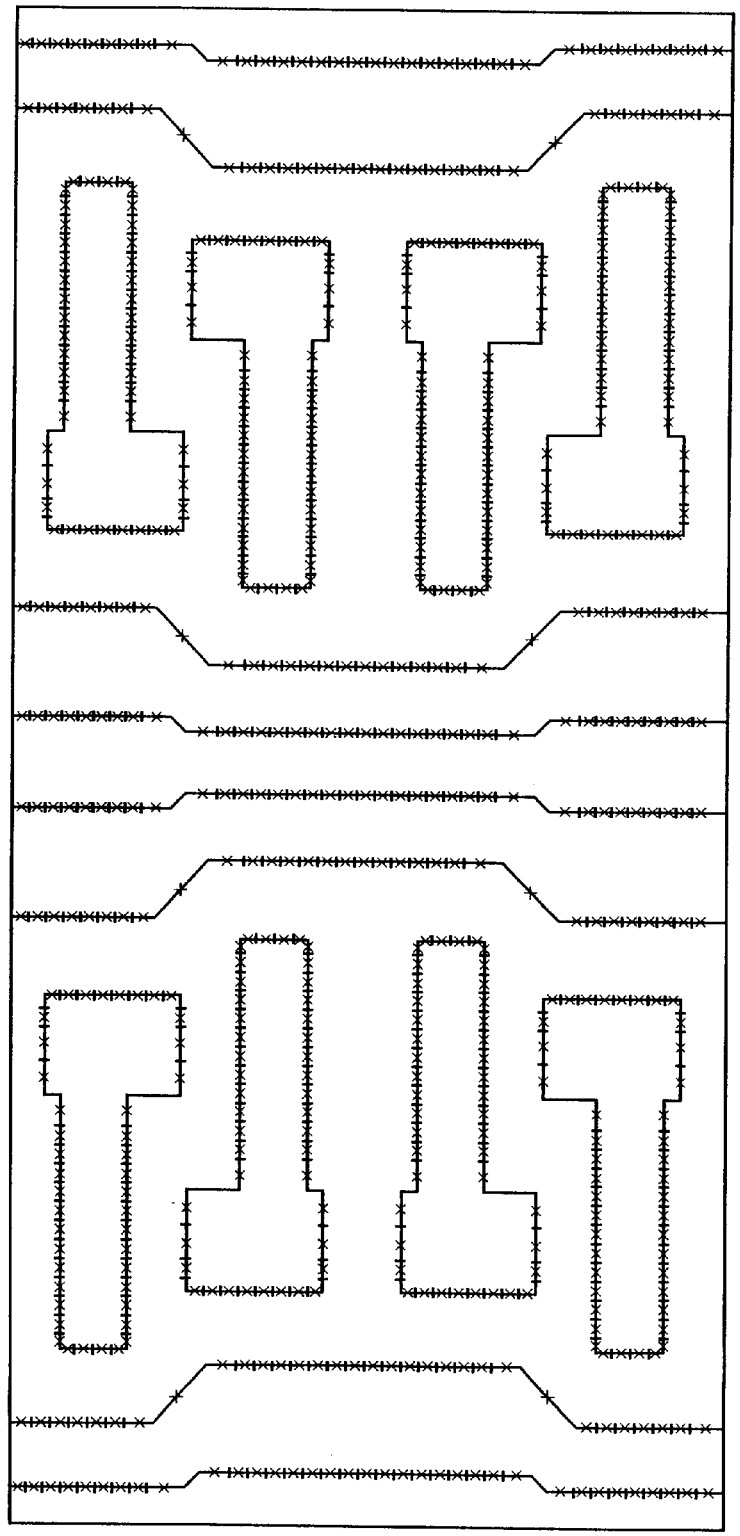
FIG. 17 is an illustration showing assigned evaluation points in the example of the second comparison.
Figure 18:
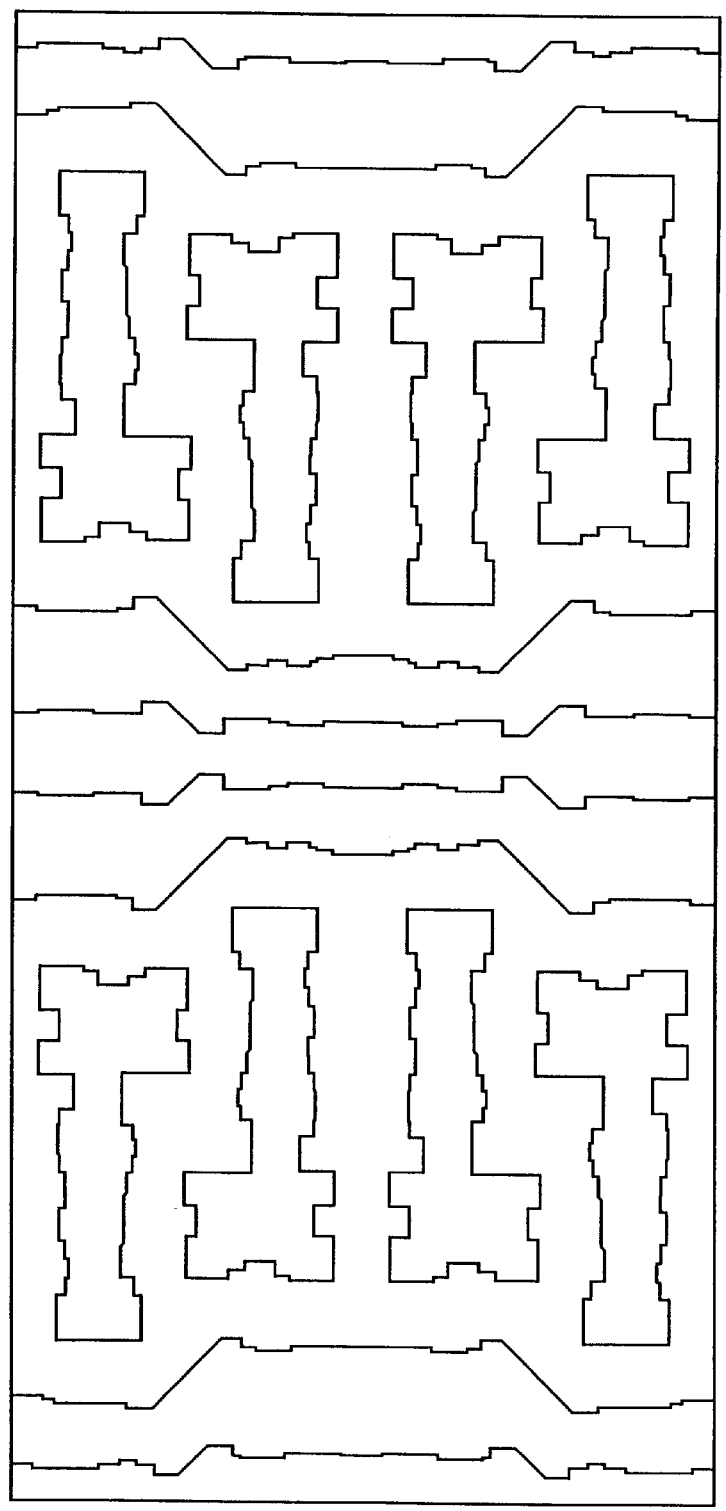
FIG. 18 is an illustration showing a corrected exposure pattern in the example of the second comparison.
Figure 19:
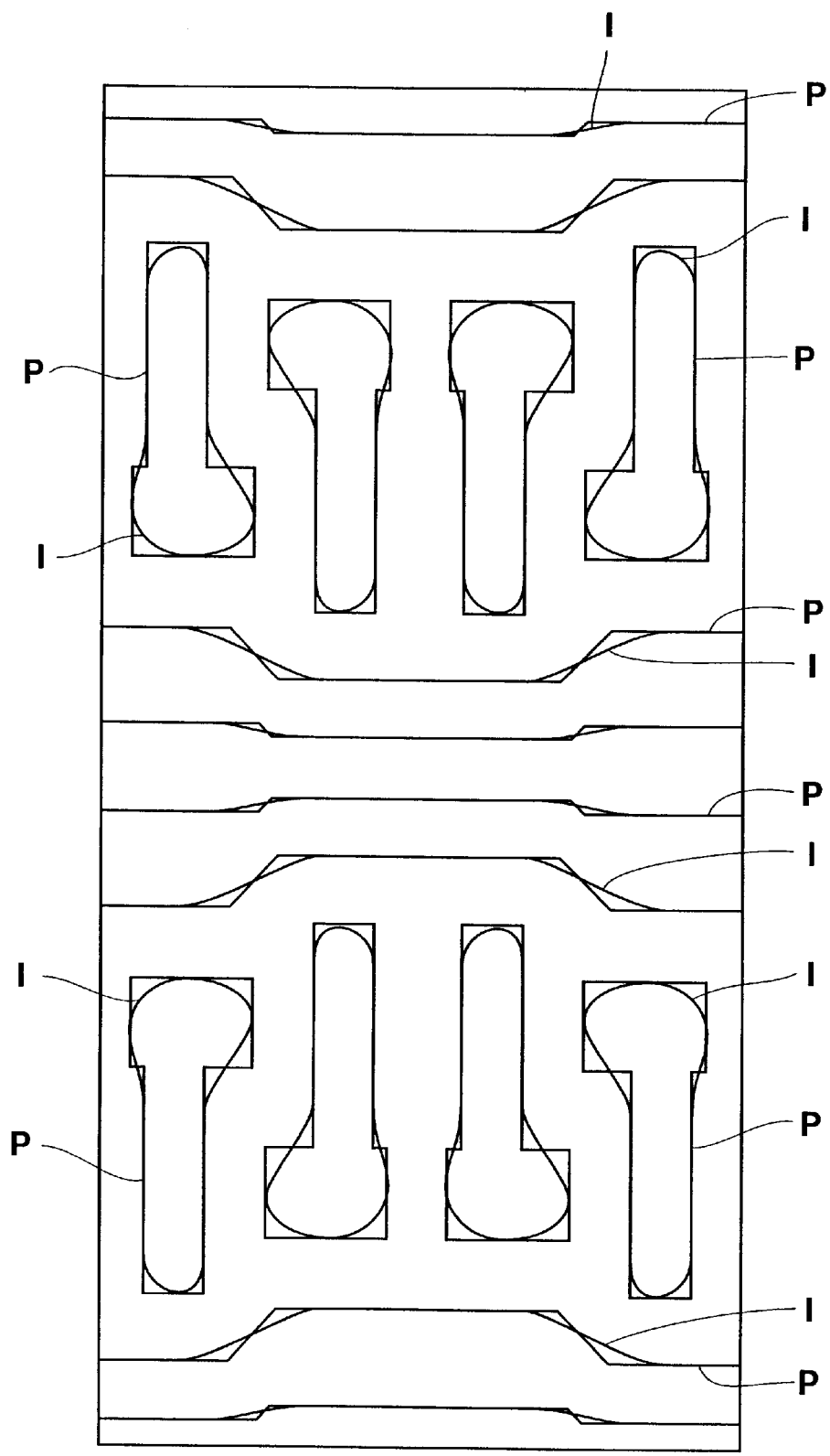
FIG. 19 is an illustration showing a transferred image by the corrected exposure pattern of FIG. 18 in the example of the second comparison.

Furthermore, FIG. 16 shows the pitch between edges obtained by dividing a design pattern P, which is reduced to a half of that used in the related art correcting method shown in FIG. 13. FIG. 17 shows how an evaluation point is assigned to the center of each edge. FIG. 18 shows a masking pattern that uses a corrected exposure pattern so that the offset at the evaluation point is minimized. In addition, FIG. 19 shows a transferred image formed when the masking pattern shown in FIG. 18 is used.

Such the shortening of the pitch between edges is insufficient yet to correct the portion around the evaluation point; the correction will be badly influenced, for example, part of the transferred image I is protruded from the design pattern P. Furthermore, the shorter the pitch between edges becomes, the more the masking pattern is complicated, making it difficult to create a mask as shown in FIG. 18.

On the contrary, the first embodiment has the following advantages; the transferred image I is not protruded unnecessarily from the design pattern P and the masking pattern is not complicated so much.

Subsequently, the second embodiment of this invention will be explained. FIG. 20 through FIG. 24 are illustrations for explaining the second embodiment. In the second embodiment, a polysilicon layer of 0.20 $\mu$m rule SRAM is exposed to a light on the conditions (wave length=248 nm, NA=0.55, and σ=0.60).

Figure 20:
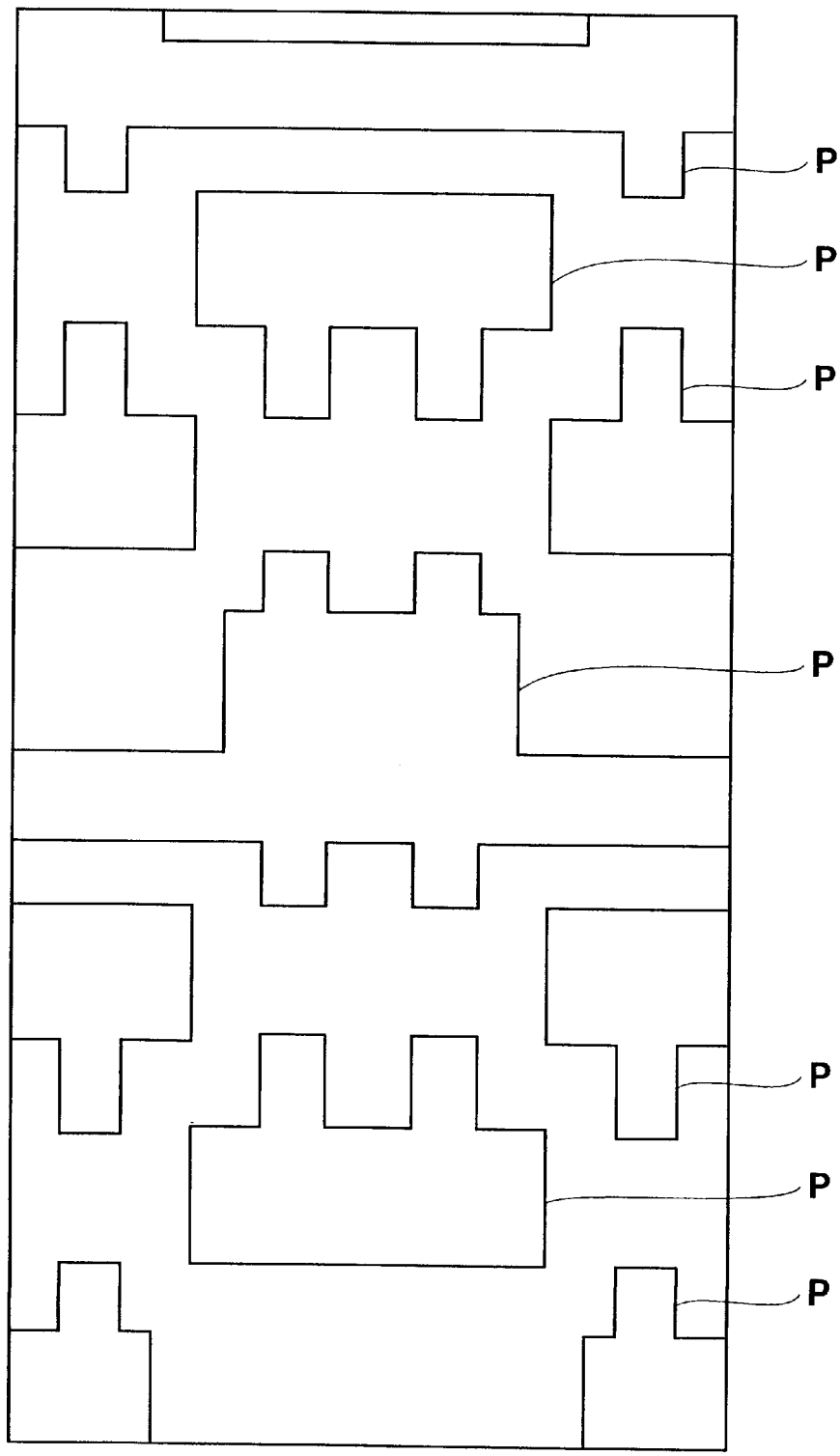
FIG. 20 is an illustration showing a design pattern in the second embodiment.
Figure 21:
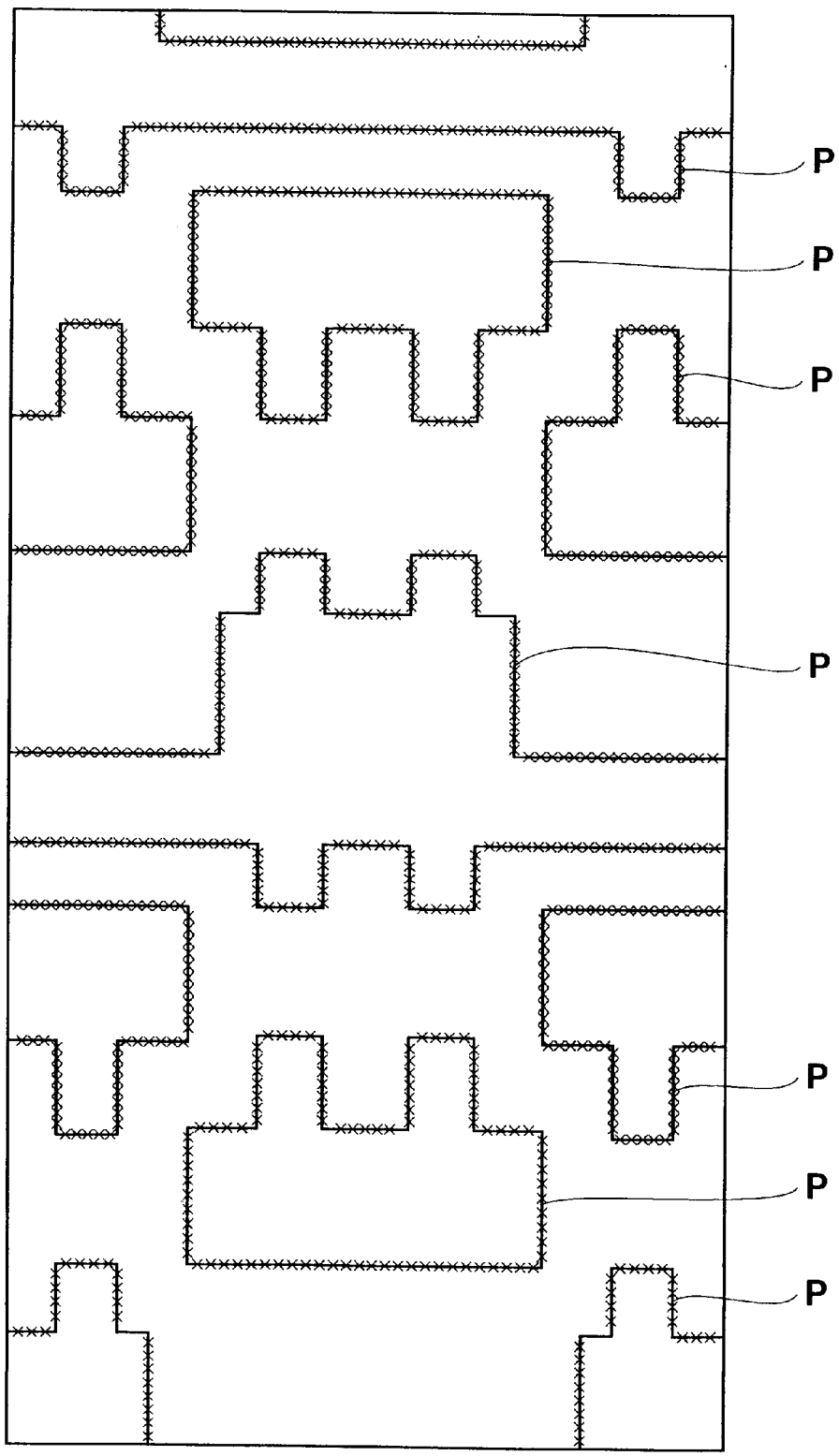
FIG. 21 is an illustration showing assigned evaluation points in the second embodiment.

FIG. 20 shows a design pattern used in the second embodiment. The exposure pattern is thus corrected to obtain a transferred image as approximately to this design pattern P as possible. At first, a plurality of evaluation points (x marks) are assigned to the visible outline of a design pattern P at specified pitches as shown in FIG. 21. Although the visible outline of the design pattern P is divided at specified pitches in the first embodiment, such dividing is made only at corners of the design pattern in the second embodiment.

Figure 22:
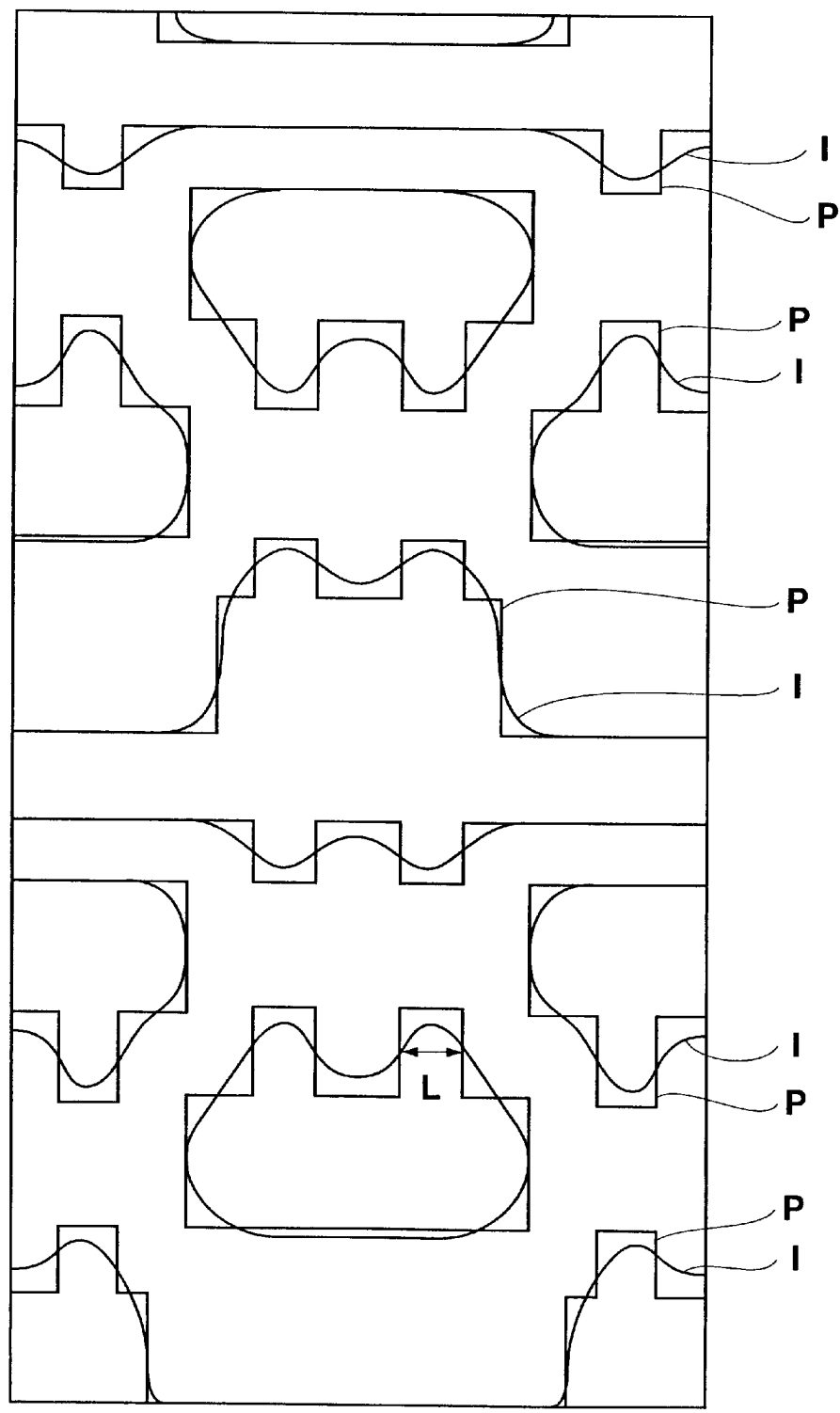
FIG. 22 is an illustration showing a transferred image due to the design pattern of FIG. 20 in the second embodiment.

Then, the light intensity distribution obtained when this design pattern P is transferred at a just focus using a mask that is completely the same as the design pattern is found to find contour lines sliced according to the specified threshold value of the light intensity as a transferred image. FIG. 22 shows this transferred image I put on top of the design pattern P. This specified threshold value of light intensity is set so that the length L shown in FIG. 22 becomes 0.20 $\mu$m, which is a pattern rule.

Subsequently, at each evaluation point added to an edge are found the offset from the position corresponding to the evaluation point of the transferred image I, as well as the inclination at the position corresponding to the evaluation point of the transferred image I. At this time, the direction for measuring the offset of the transferred image I is defined to be vertical to the linear direction of the design pattern P and the direction outward from the design pattern P is defined to be forward.

In this case, the offset obtained in correspondence to each evaluation point is defined as E and the inclination of the transferred image I corresponding to each evaluation point is defined as S.

Then, the E and S are substituted for the following expression to compute the correction value (bias value B) of each of the edges. This bias value B is assumed as a correction pattern value to be added to the object exposure pattern.

$$B=-0.5 \cdot \Sigma(Ei/Si^2)/\Sigma(1/Si^2)$$

In this expression, Ei indicates the offset at the i-th evaluation point between corners of the visible outline of the design pattern and Si indicates the inclination at the i-th evaluation point between corners of the visible outline of the design pattern.

Since the visible outline of the design pattern P is not divided at first in the second embodiment, each portion between corners of the design pattern is assumed as an edge, which is a unit of biasing, then the edge is biased. The above expression is used when a peak is found in the offset corresponding to the evaluation points at both ends of the edge between corners of the design pattern. The meaning of each coefficient is the same as that in the first embodiment.

If an offset peak is found at any evaluation point other than those at both ends of an edge (between corners of a design pattern), the following expression is used to compute the bias value.

$$B=-0.5 \cdot Ep$$

Ep indicates the offset at an evaluation point corresponding to the peak. Meanings of coefficients in this expression are the same as those in the first embodiment.

After the bias value B is found with the above expression, the exposure pattern corresponding to the edge (between corners of the design pattern) is moved and corrected according to the bias value B to obtain a corrected exposure pattern. After this corrected exposure pattern is obtained, the same computing is repeated as needed while the evaluation point positions are kept as are. Thus, the optimized exposure pattern is obtained.

Figure 23:
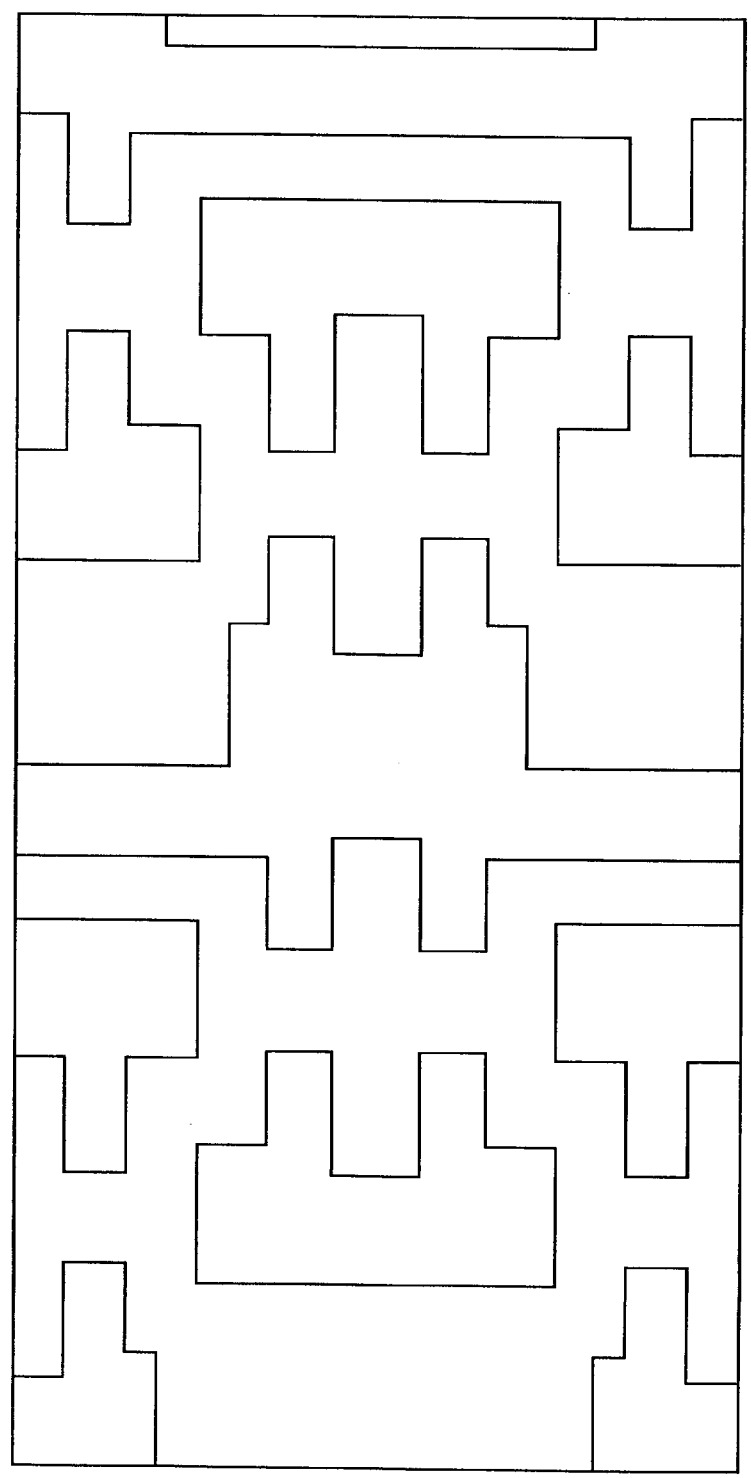
FIG. 23 is an illustration showing a corrected exposure pattern in the second embodiment.
Figure 24:
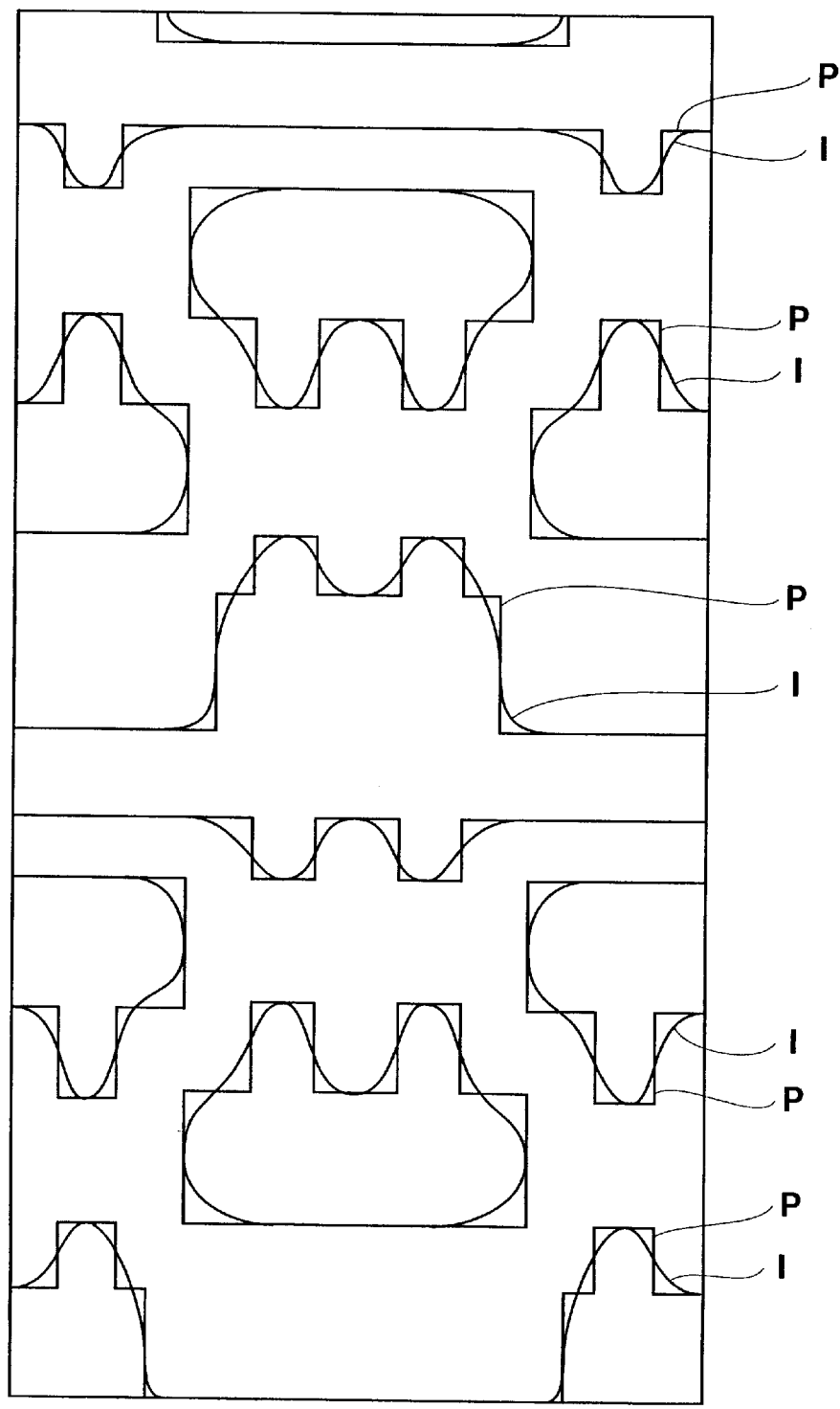
FIG. 24 is an illustration showing a transferred image by the corrected exposure pattern of FIG. 23 in the second embodiment.

FIG. 23 shows a corrected exposure pattern obtained by such a computing. This exposure pattern is then used as a mask to form the object exposure pattern and accordingly to form the transferred image I as shown in FIG. 24. And, with such a correction, the shrinkage of the line end in the design pattern P is reduced more significantly than in the transferred image I before correction shown in FIG. 22, so that controlling of the line width is much improved.

The correcting method in the second embodiment can also eliminate necessity of adding small patterns for correcting the masking pattern, as well as it can correct the exposure pattern without increasing the number of masking patterns. Consequently, a favorable transferred image can be obtained without increasing the cost of the mask.

Subsequently, the third embodiment of this invention will be explained. FIG. 25 through FIG. 31 are illustrations for explaining the third embodiment. In the third embodiment, a polysilicon layer of 0.15 μm rule SRAM is patterned using an electron beam lithographic apparatus whose acceleration voltage is 50 kV.

Figure 25:
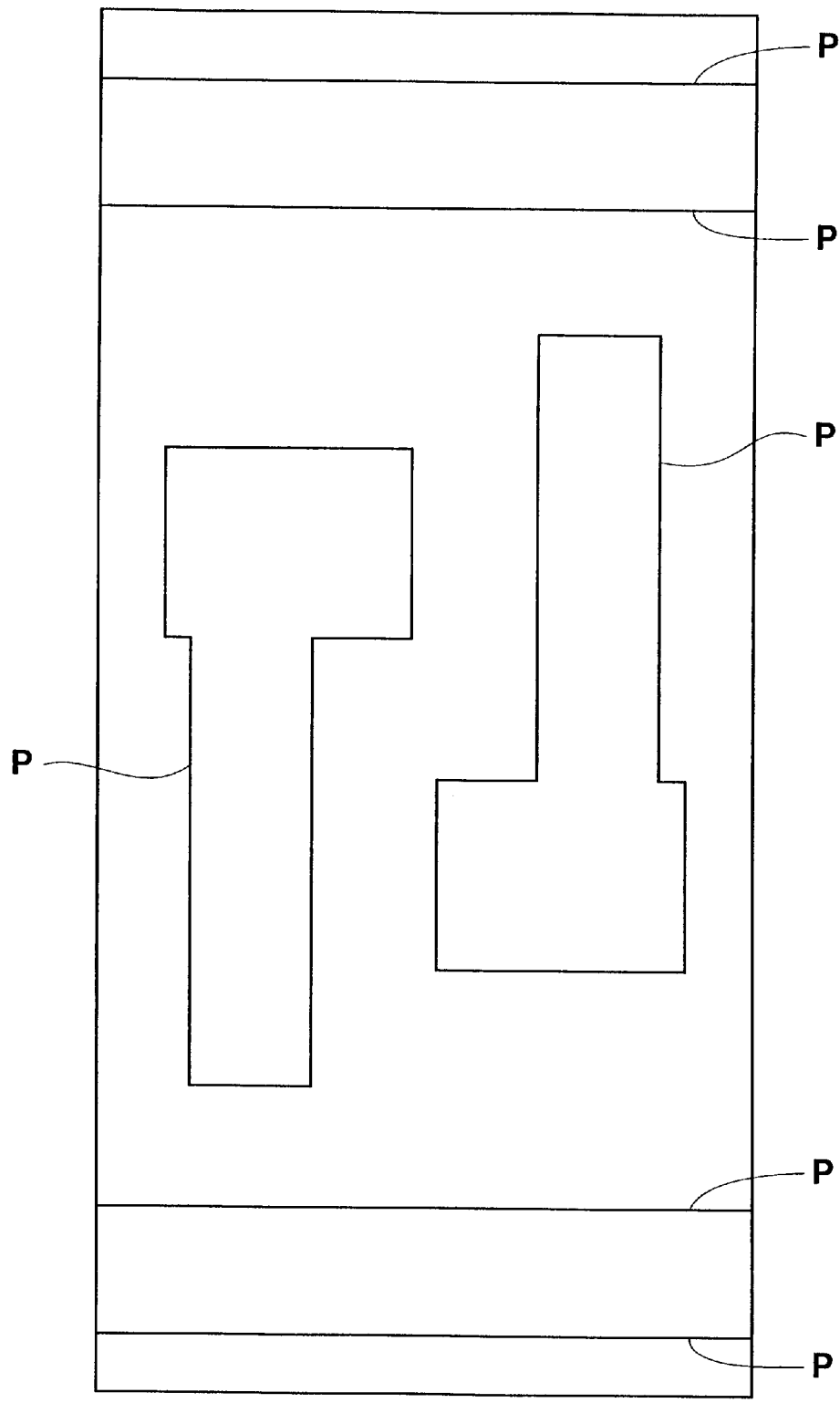
FIG. 25 is an illustration showing a design pattern in the third embodiment.
Figure 26:
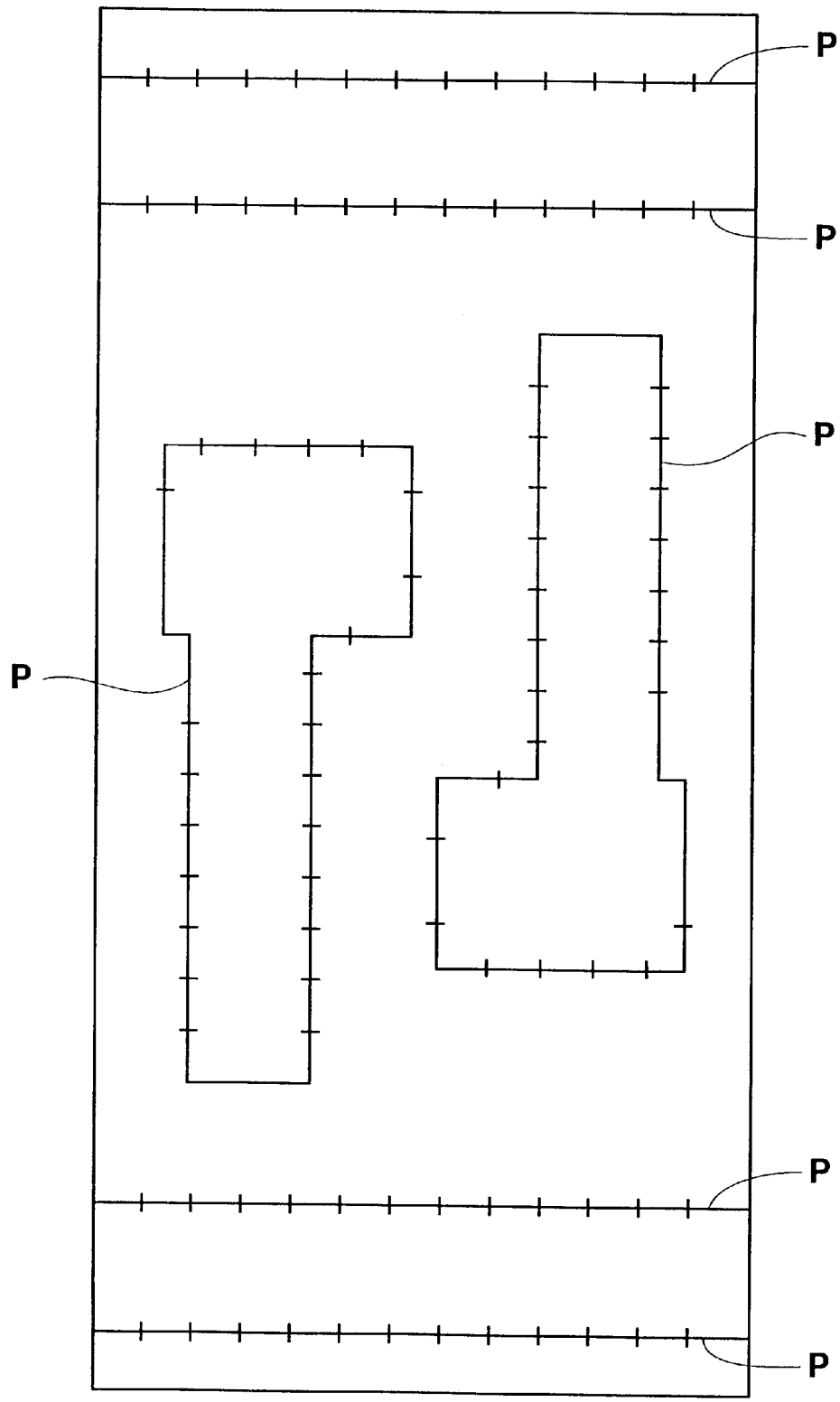
FIG. 26 is an illustration showing division of the design pattern in the third embodiment.
Figure 27:
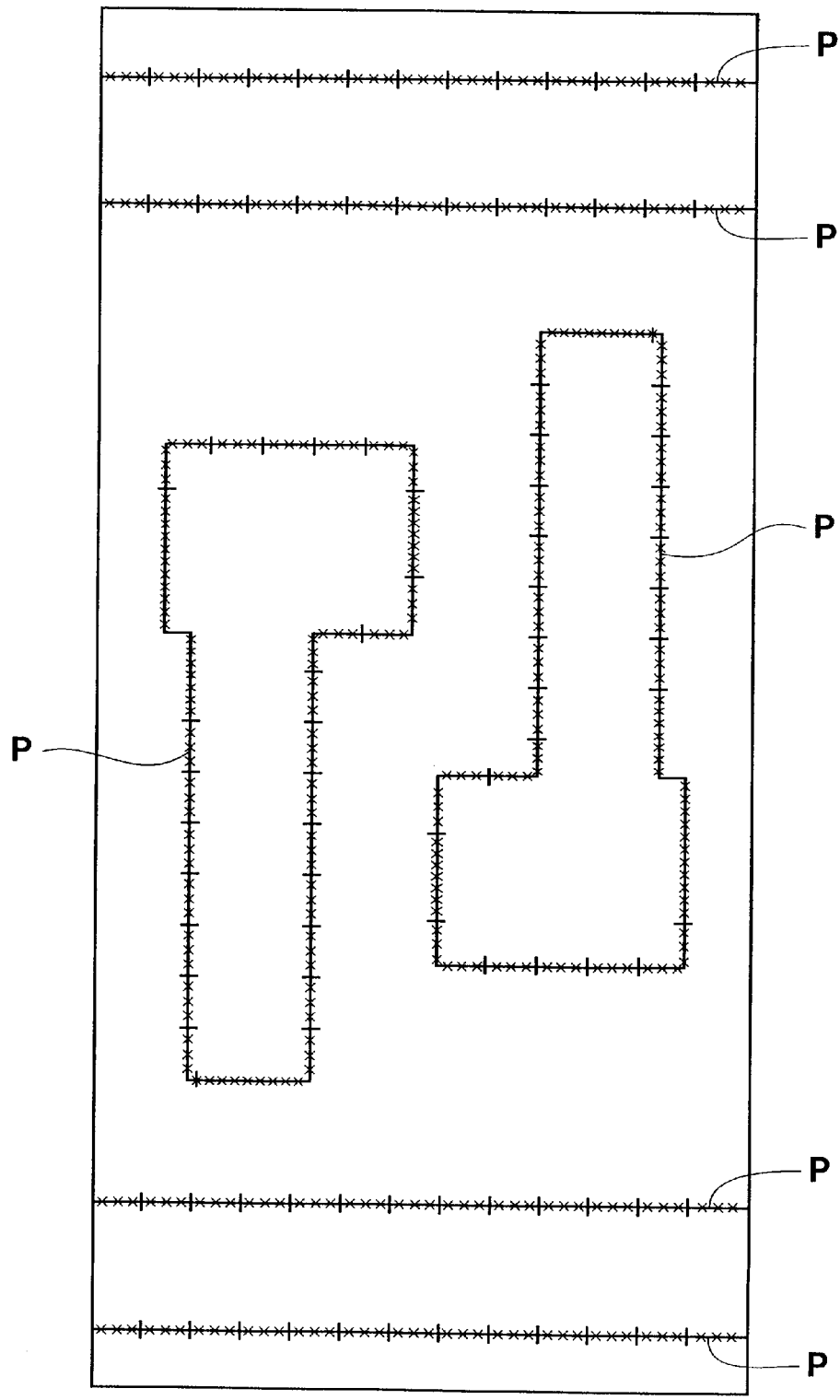
FIG. 27 is an illustration showing assigned evaluation points in the third embodiment.

FIG. 25 shows a design pattern used in the third embodiment. The object exposure (lithographic) pattern is thus corrected using an electron beam lithographic apparatus so as to obtain a transferred pattern closest possible to this design pattern P. For this purpose, at first the visible outline of the design pattern P is divided at specified pitches as shown in FIG. 26 to form a plurality of edges. Then, a plurality of evaluation points (x marks) are assigned to each of those edges as shown in FIG. 27.

Figure 28:
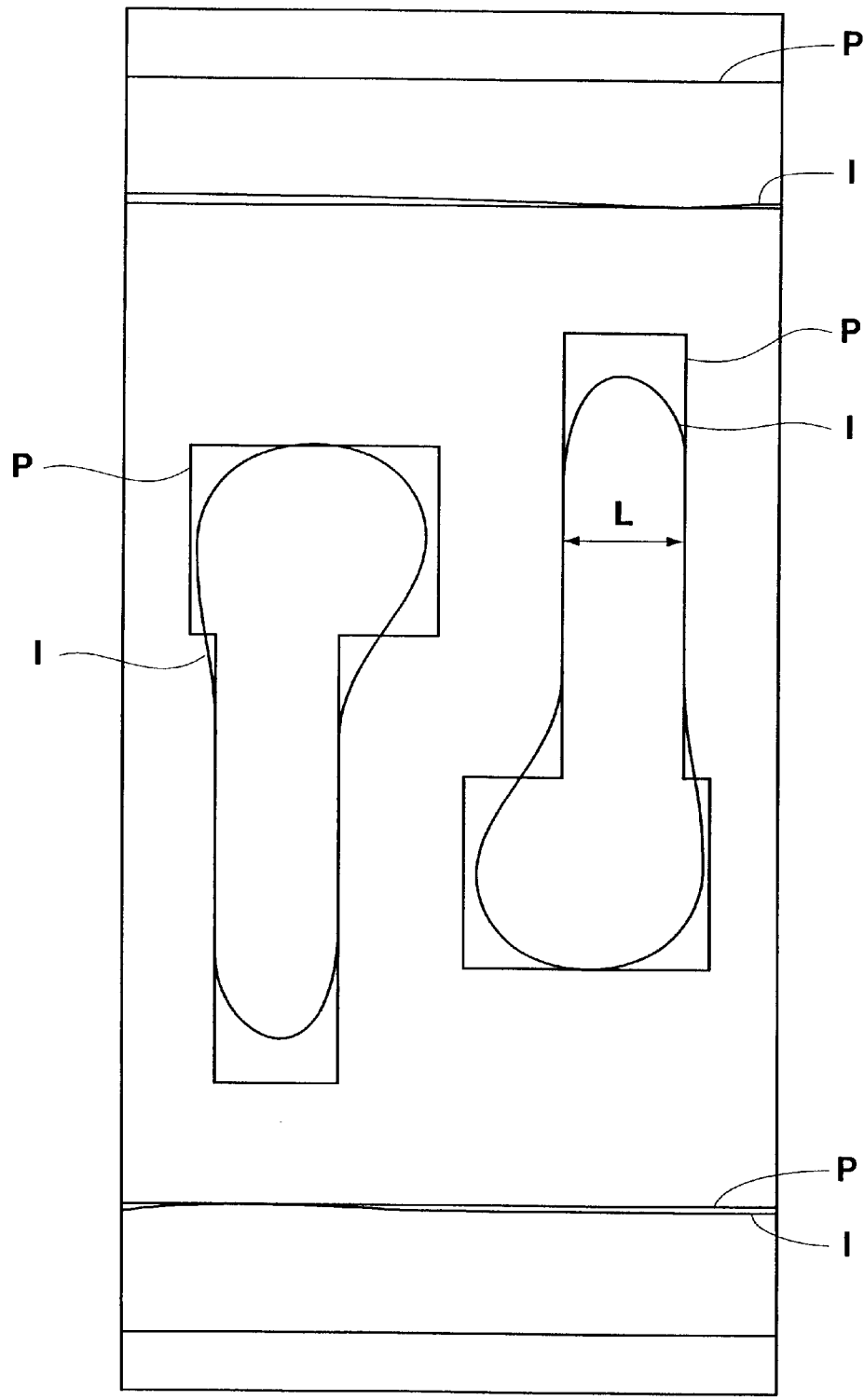
FIG. 28 is an illustration showing a transferred image by lithography with the design pattern of FIG. 25 in the third embodiment.

Then, the energy intensity distribution when this design pattern P is directly patterned is found to find contour lines sliced according to the specified threshold value as a transferred pattern. FIG. 28 shows this transferred image I put on top of the design pattern P.

After this, at each evaluation point added to each edge, the offset from the position corresponding to an evaluation point of the transferred image I, which represents contour lines of the energy intensity, as well as the inclination of the transferred pattern I at the position corresponding to the evaluation point are found. At this time, the direction for measuring the offset of the transferred image I is defined to be vertical to the design pattern P linear direction and the direction outward from the design pattern P is defined to be forward.

The offset value obtained in correspondence to each evaluation point here is defined as E and the inclination of the transferred image I corresponding to each evaluation point is defined as S.

After this, the obtained E and S are substituted for the following expression to compute the correction value (bias value B) of each edge. This bias value B is assumed as the corrected pattern value added to the object exposure pattern.

$$B = -0.5 \cdot \Sigma(Ei/Si^2)/\Sigma(1/Si^2)$$

Ei indicates the offset value at the i-th evaluation point of the edge and Si indicates the inclination at the i-th evaluation point of the edge. This expression is used when a peak is found in the offset corresponding to the evaluation points at both ends of the edge (between corners of the design pattern). The meaning of each coefficient is the same as that in the first embodiment.

When an offset peak is found at any evaluation point other than those at both ends of the edge, the following expression is used to find the bias value.

$$B = -0.5 \cdot Ep$$

Ep indicates the offset value at the evaluation point corresponding to the peak. The meanings of coefficients in this expression are the same as those in the first embodiment.

After the bias value B is found with the above expression according to how the transferred image I is inclined at each edge, the lithographic pattern corresponding to each edge is moved according to the bias value B to obtain a corrected lithographic pattern. After a corrected lithographic pattern is obtained in this way, the same computation is repeated as needed to obtain the optimized lithographic pattern while the position of each evaluation point is kept as is.

Figure 29:
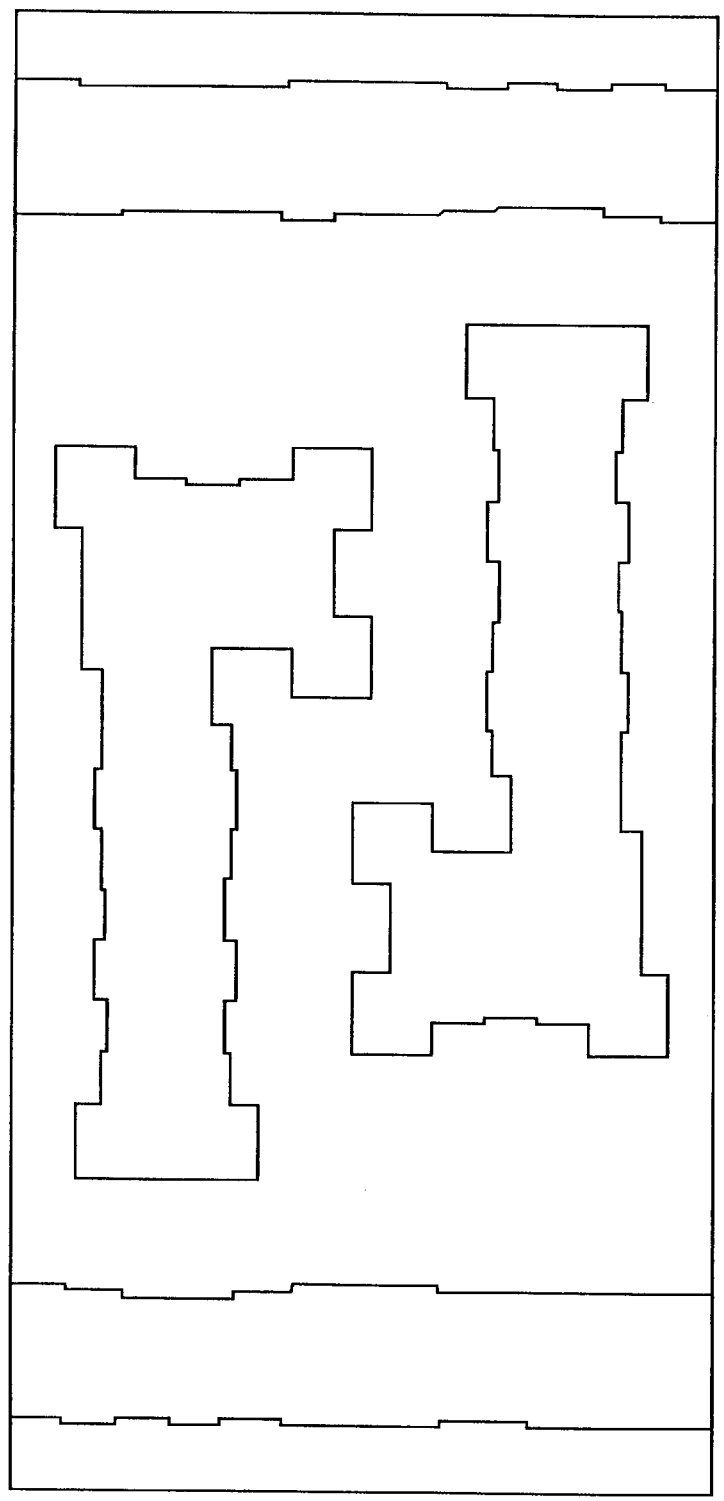
FIG. 29 is an illustration showing a corrected lithographic pattern in the third embodiment.
Figure 30:
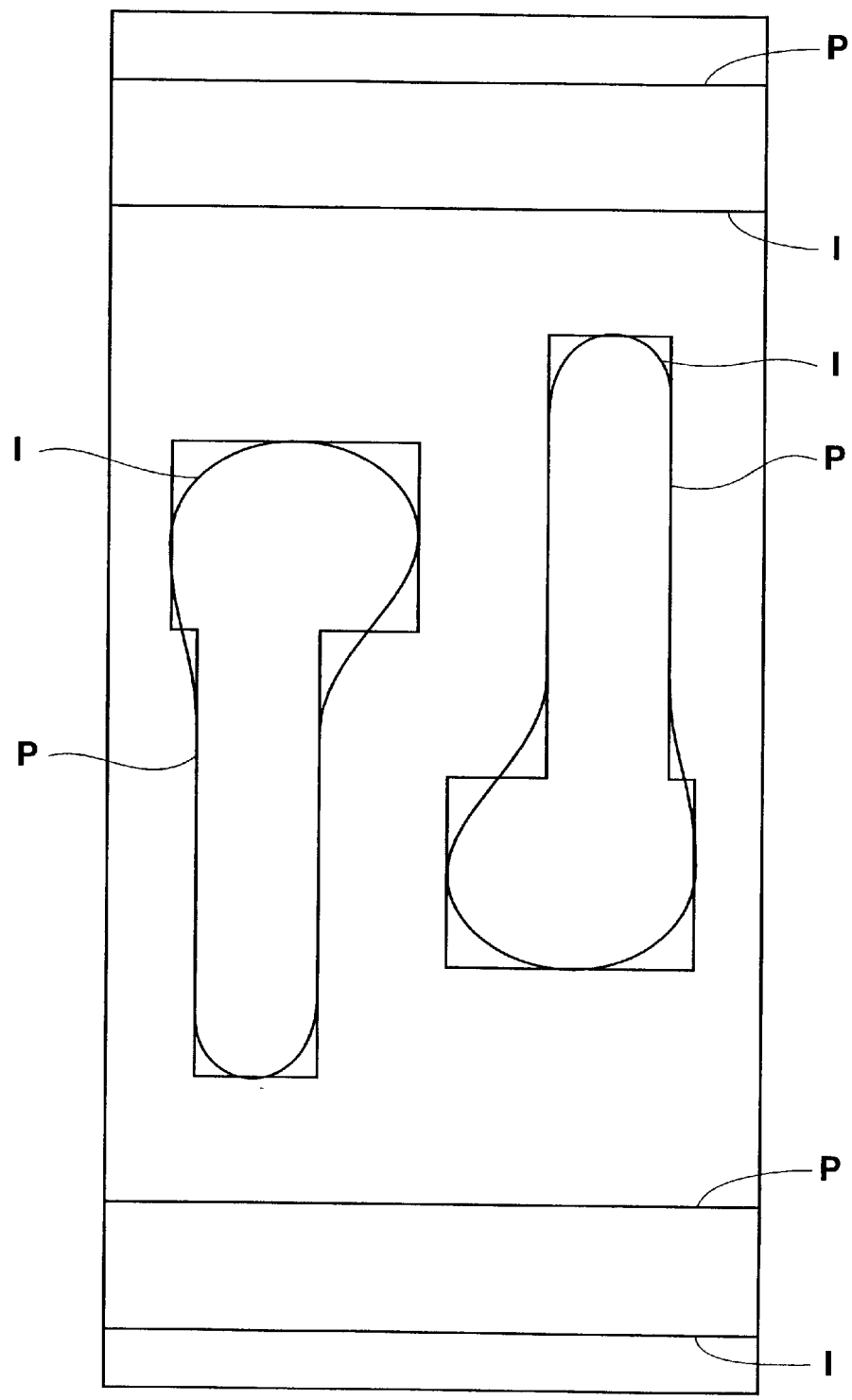
FIG. 30 is an illustration showing a transferred image by lithography with the corrected lithographic pattern of FIG. 29 in the third embodiment.

FIG. 29 shows a corrected lithographic pattern obtained by such a computation. Such a pattern used for drawing can form the transferred image I as shown in FIG. 30. With this correction, the shrinkage of the line end in the design pattern P can be reduced more significantly than in the transferred image I before correction as shown in FIG. 28, so that a transferred image I as approximately to the design pattern P as possible can be obtained.

Figure 31:
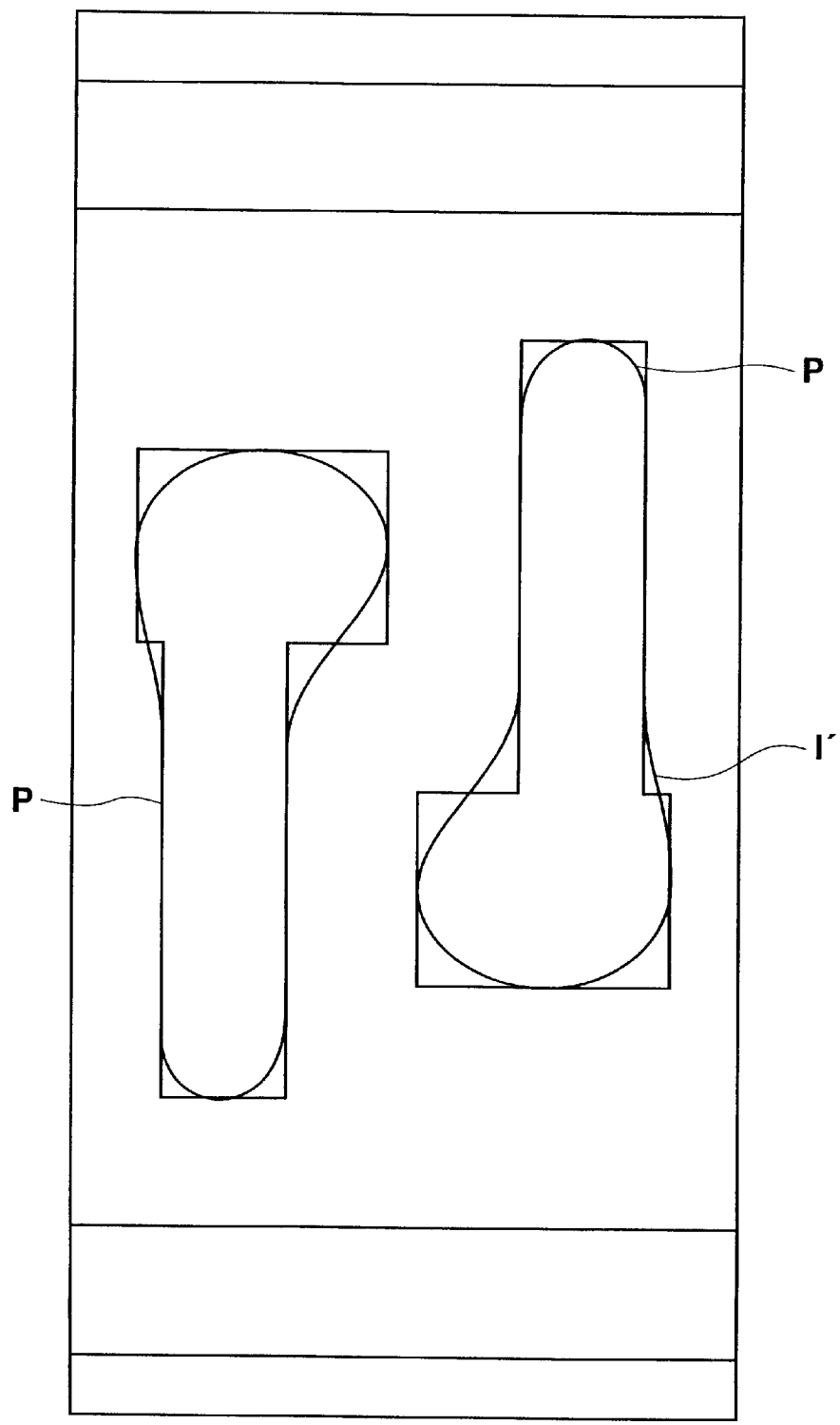
FIG. 31 is an illustration showing a transferred image by an electron beam lithographic apparatus with the corrected lithographic pattern of FIG. 29 in the third embodiment.

After this, the electron beam lithographic apparatus draws a pattern directly with the corrected lithographic pattern. FIG. 31 shows a transferred image I' drawn directly with this lithographic pattern, which is put on top of the design pattern. When a lithographic (exposure) pattern is corrected as described above even for drawing using an electron beam lithographic apparatus, a transferred image closest possible to the design pattern P can be obtained. This makes it possible to form transferred images at a high accuracy.

Hereunder, another example of the third embodiment will be explained; a stencil mask is used in an electron beam lithographic apparatus for a batch exposure. In this example, a polysilicon layer for 0.15 μm rule SRAM is patterned using a stencil masking pattern in an electron beam lithographic apparatus.

As shown in FIG. 27, the exposure (lithographic) pattern is corrected as follows by the electron beam lithographic apparatus so as to obtain a transferred pattern closest possible to this design pattern P. At first, the visible outline of the design pattern P is divided at specified pitches as shown in FIG. 26 to form a plurality of edges. Then, a plurality of evaluation points (x marks) are added to each of those edges as shown in FIG. 27.

After this, the energy intensity distribution when this design pattern P is directly patterned is found to find the contour lines sliced according to the specified threshold value as a transferred image. FIG. 28 shows this transferred image I put on top of the design pattern P.

After this, at each evaluation point added to each edge, the offset from the position corresponding to an evaluation point of the transferred image I, represented by a contour line of the energy intensity, as well as the inclination of the transferred image I at the position corresponding to an evaluation point of the transferred image I. At this time, the direction for measuring the offset of the transferred image I is defined to be vertical to the linear direction of the design pattern P and the direction outward from the design pattern P is defined to be forward.

In this example, the offset obtained in correspondence to each evaluation is defined as E and the inclination of the transferred image I corresponding to each evaluation point is defined as S.

Then, the obtained E and S are substituted for the following expression to compute the correction value (bias value B) of each edge. This bias value B is a correction pattern value added to the object exposure pattern.

$$B = -0.5 \cdot \Sigma(Ei/Si^2)/\Sigma(1/Si^2)$$

In this expression, Ei indicates the offset value at the i-th evaluation point of the edge and Si indicates the inclination at the i-th evaluation point of the edge. This expression is used when a peak is found in the offset value corresponding to evaluation points at both ends of the edge between corners of the design pattern. The meaning of each coefficient is the same as that in the first embodiment.

If a peak is found in the offset value at any evaluation point other than those at both ends of an edge, the following expression is used to compute the bias value.

$$B=-0.5 \cdot Ep$$

Ep indicates the offset value at the evaluation point corresponding to the peak. The meaning of each coefficient in this expression is also the same as that in the first embodiment.

After the bias value B is computed by the above expression according to how the transferred image I is inclined at each edge, the lithographic pattern corresponding to each of those edges is moved according to the bias value B to obtain a corrected lithographic pattern. After this corrected lithographic pattern is obtained, the same computing is repeated as needed while evaluation points are kept at the same positions to obtain the optimized lithographic pattern.

FIG. 29 shows a corrected lithographic pattern obtained by such a computation. By using such a pattern for lithography, a transferred image I can be formed as shown in FIG. 30. And, with such a correction, the shrinkage of the line end in the design pattern P is reduced more significantly than in the transferred image I before correction, so that a transferred image I very close to the design pattern P can be obtained.

After this, a stencil mask of the electron beam lithographic apparatus having this corrected lithographic pattern is prepared to carry out a batch exposure by the electron beam lithographic apparatus. FIG. 31 shows a transferred image I' drawn directly using this lithographic pattern. The transferred image I' is put on the design pattern P. By correcting the lithographic (exposure) pattern such way for preparing a stencil mask while carrying out patterning with an electron beam lithographic apparatus, a transferred image closest possible to the design pattern P can be obtained, enabling high precision drawing with a high throughput.

Hereunder, the fourth embodiment of this invention will be explained. FIGS. 32 through 37 are illustrations explaining this fourth embodiment. In this embodiment, a polysilicon layer for 0.20 μm rule SRAM is exposed to a light on the conditions (wave length=248 nm, NA=0.55, and σ=0.60).

Figure 32:
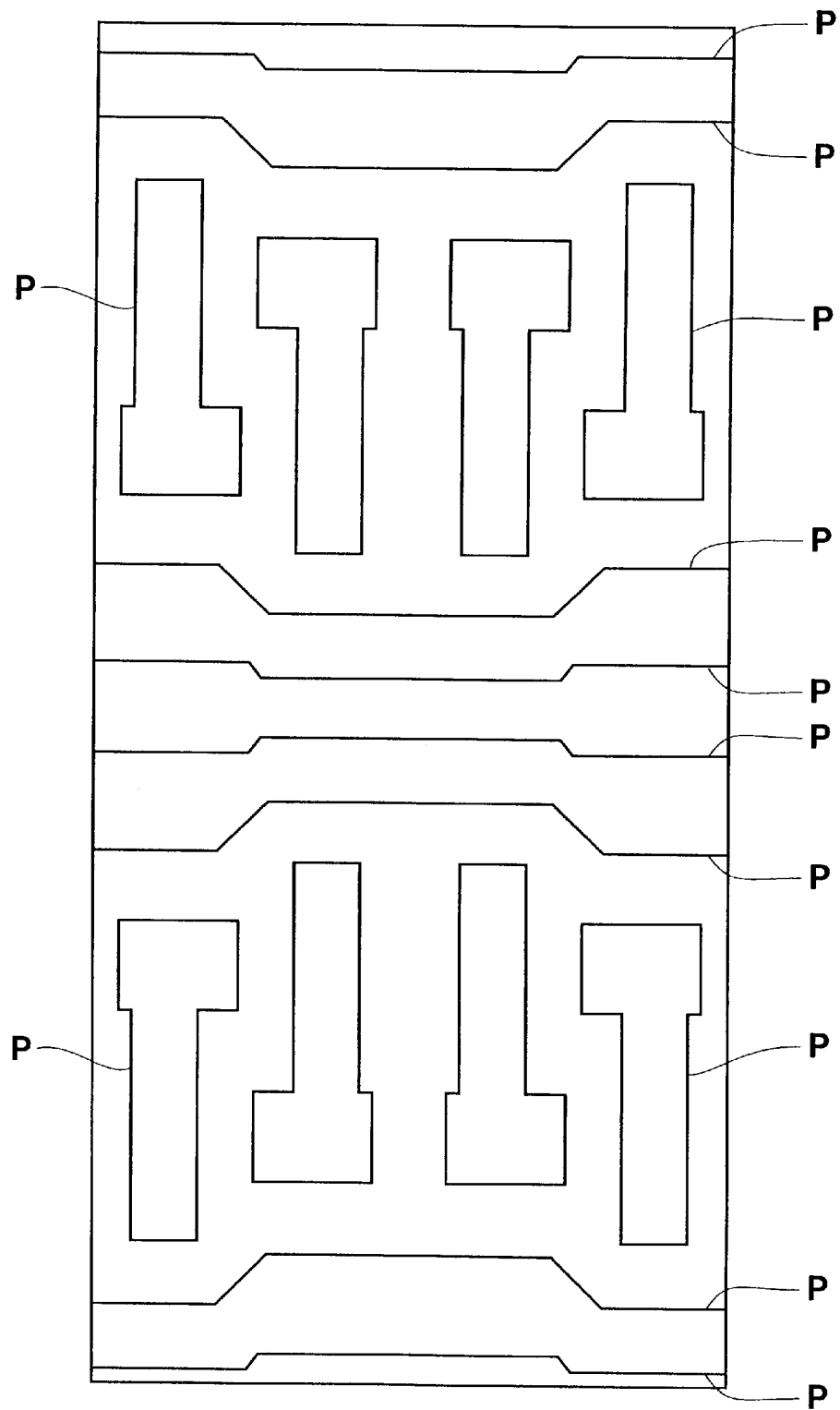
FIG. 32 is an illustration showing a design pattern in the fourth embodiment.
Figure 33:
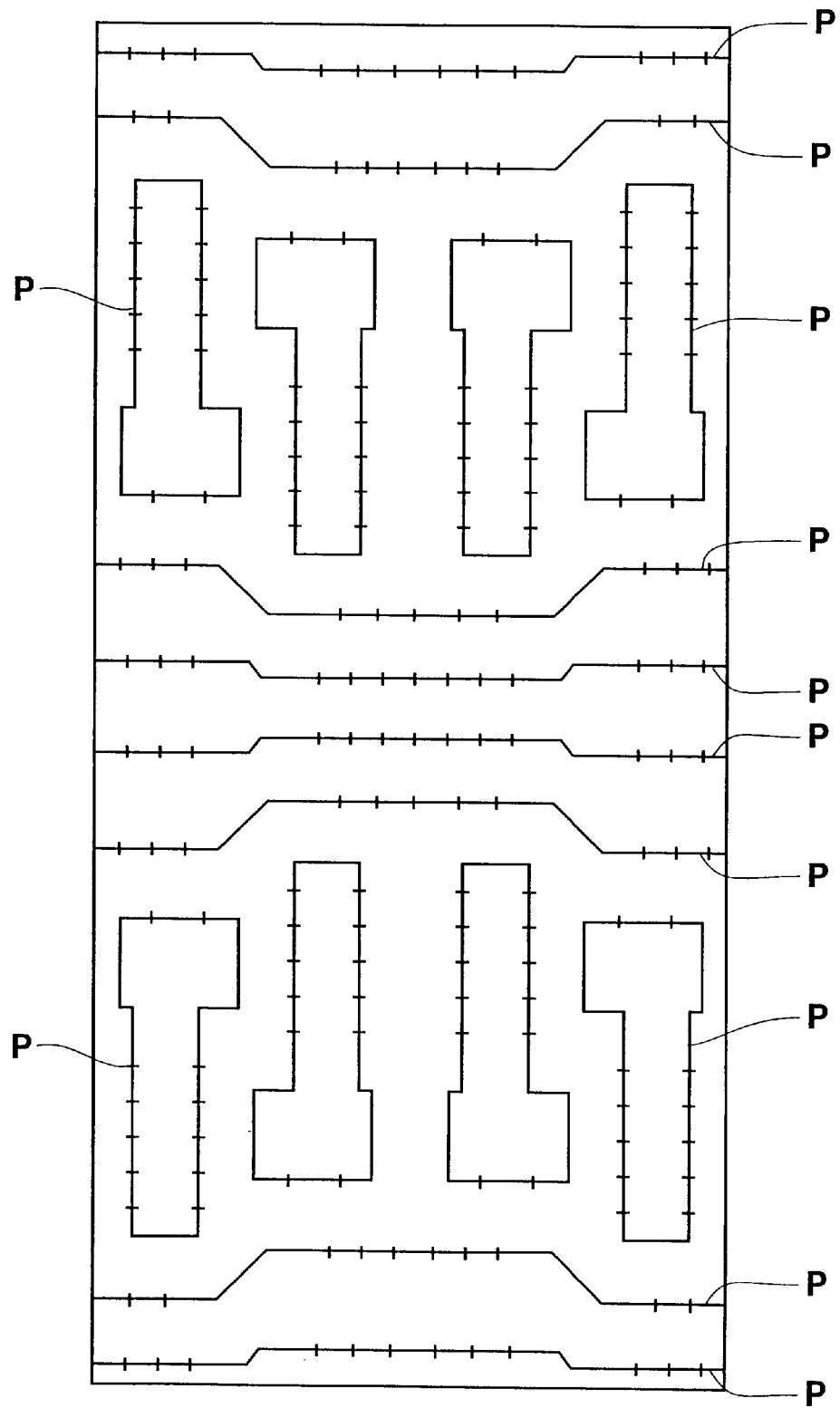
FIG. 33 is an illustration showing division of the design pattern in the fourth embodiment.

FIG. 32 shows a design pattern P used for this embodiment. As described above, therefore, the exposure pattern is to be corrected as follows so as to obtain a transferred pattern closest possible to this design pattern P. At first, the visible outline of the design pattern P is divided at specified pitches as shown in FIG. 33 to form a plurality of edges. Then, a plurality of evaluation points (x marks) are assigned to each of those edges as shown in FIG. 34.

Figure 34:
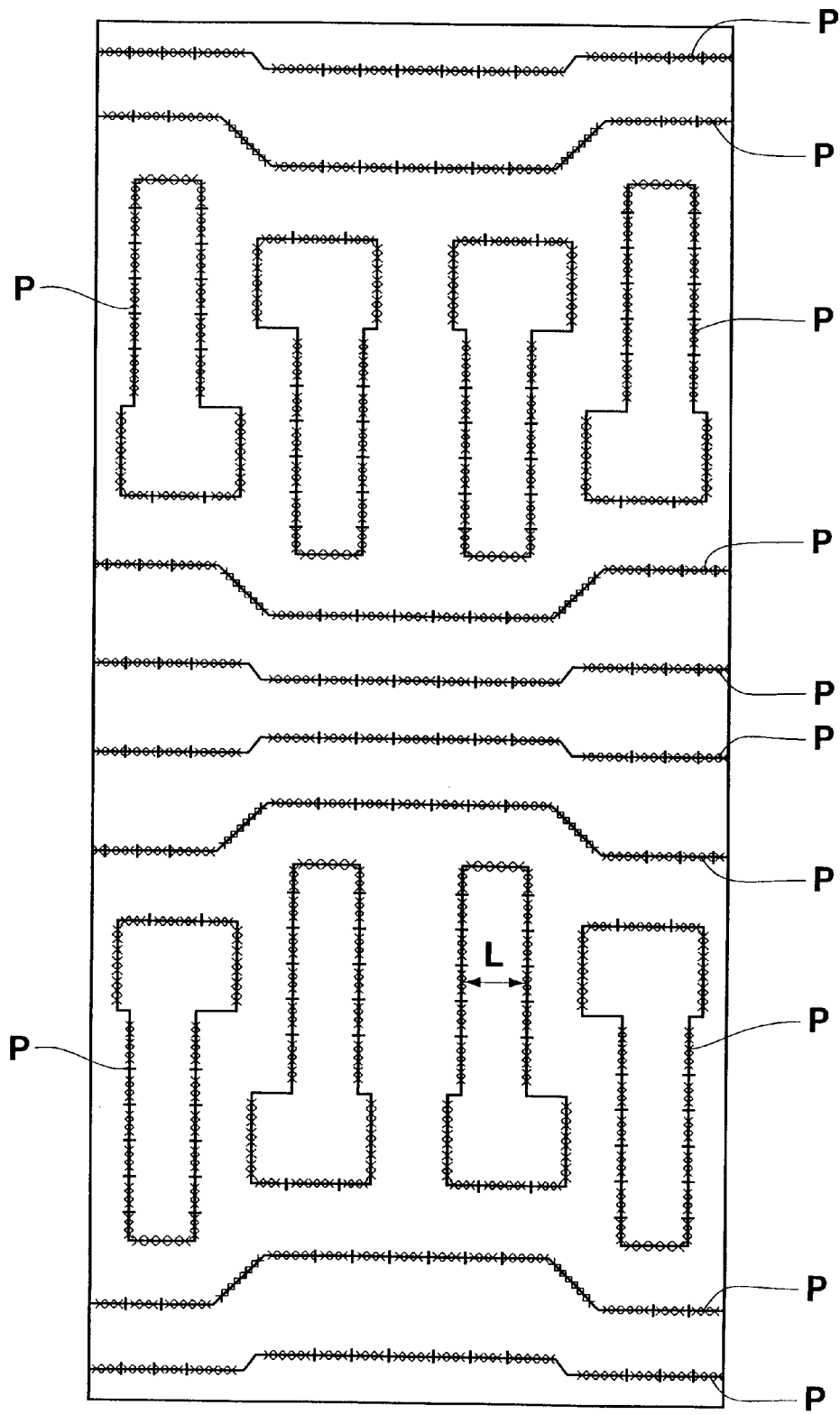
FIG. 34 is an illustration showing assigned evaluation points in the fourth embodiment.
Figure 35:
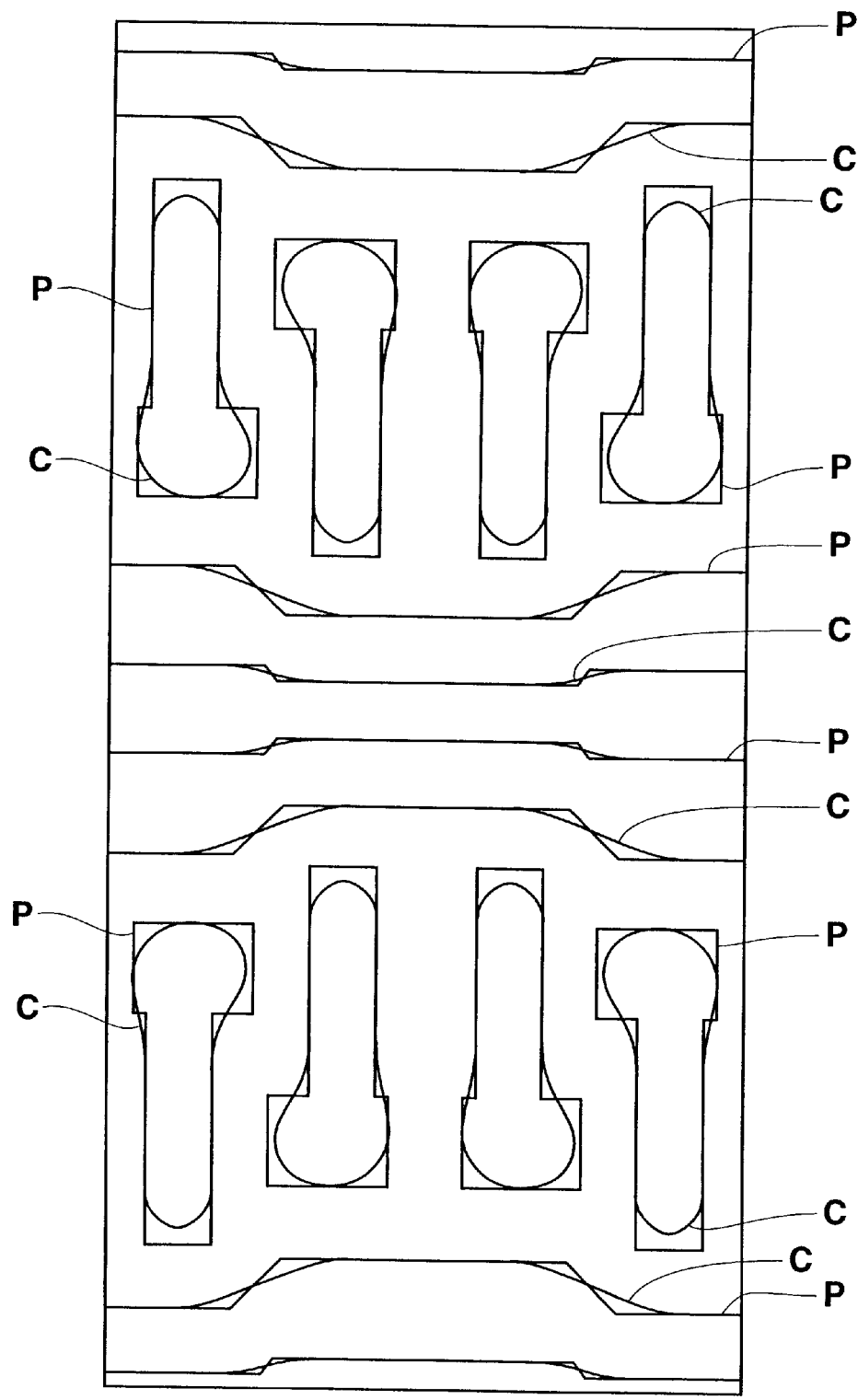
FIG. 35 is an illustration showing light intensity image due to the design pattern of FIG. 32 in the fourth embodiment.

Then, the light intensity when exposure is carried out by using a mask with this very design pattern P is found and a threshold value of the light intensity is set so that the length L of the line shown in FIG. 34 becomes 0.20 μm, which is a line rule. Then, the contour lines for which the light intensity is sliced with the threshold value are found as a light intensity image. FIG. 35 shows this light intensity image C put on the design pattern P.

After this, at each evaluation point added to each edge are found the offset from the position corresponding to an evaluation point of the light intensity image C and the inclination at the position corresponding to an evaluation point of the light intensity image C. At this time, the direction for measuring the offset of the light intensity image C is defined to be vertical to the linear direction of the design pattern P and the direction outward from the design pattern P is defined to be forward.

Here, the offset obtained in correspondence to each evaluation point is defined as E and the inclination of the light intensity image C corresponding to each evaluation point is defined as S.

Subsequently, both of the offset E and the inclination S obtained as above are substituted for the following expression to compute the correction value (bias value B) of each of the edges. This bias value B is assumed as a correction pattern value added to the object exposure pattern.

$$B=-0.1\Sigma(Ei/Si^2)/\Sigma(1/Si^2)$$

In this expression, Ei indicates the light intensity offset (error) at the i-th evaluation point of each edge and Si indicates the inclination of the light intensity error at the i-th evaluation point of each edge.

This expression is used when a peak is included in the offset corresponding to the evaluation points at both ends of the edge and the meaning of each coefficient is the same as that in the first embodiment.

On the other hand, if a peak is included in the offset at any evaluation point other than those at both ends of the edge, the following expression is used to compute the bias value.

$$B=0.1 \cdot Ep$$

In this expression, Ep indicates the offset (error) of the light intensity at the evaluation point corresponding to the peak. The meaning of each coefficient in this expression is also the same as that in the first embodiment.

After the bias value B is computed by the above expression according to how the light intensity image C is inclined at each edge, the drawing pattern corresponding to each of those edges is moved according to the bias value B to obtain a corrected drawing pattern. After this corrected drawing pattern is obtained, the same computing is repeated as needed while evaluation points are kept at the same positions to obtain the optimized drawing pattern.

Figure 36:
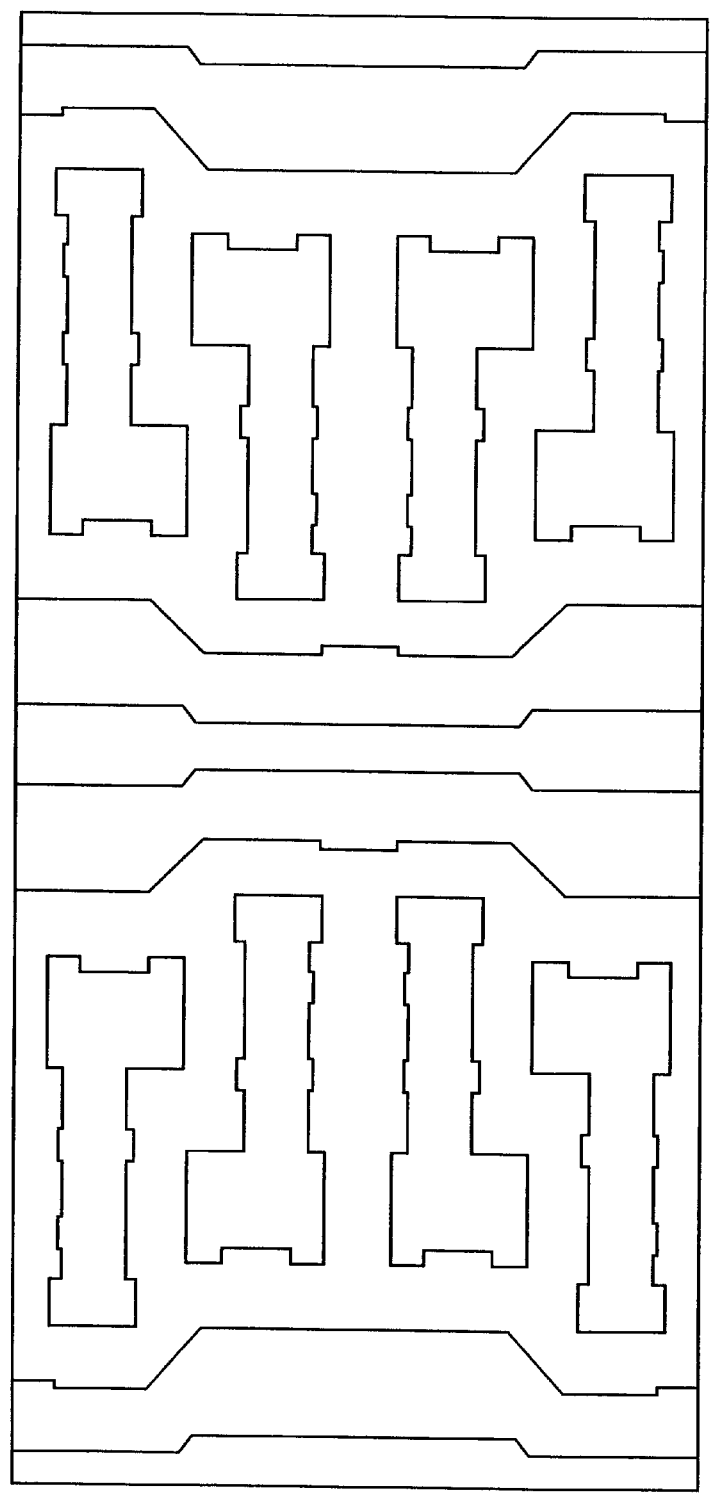
FIG. 36 is an illustration showing a corrected exposure pattern in the fourth embodiment.
Figure 37:
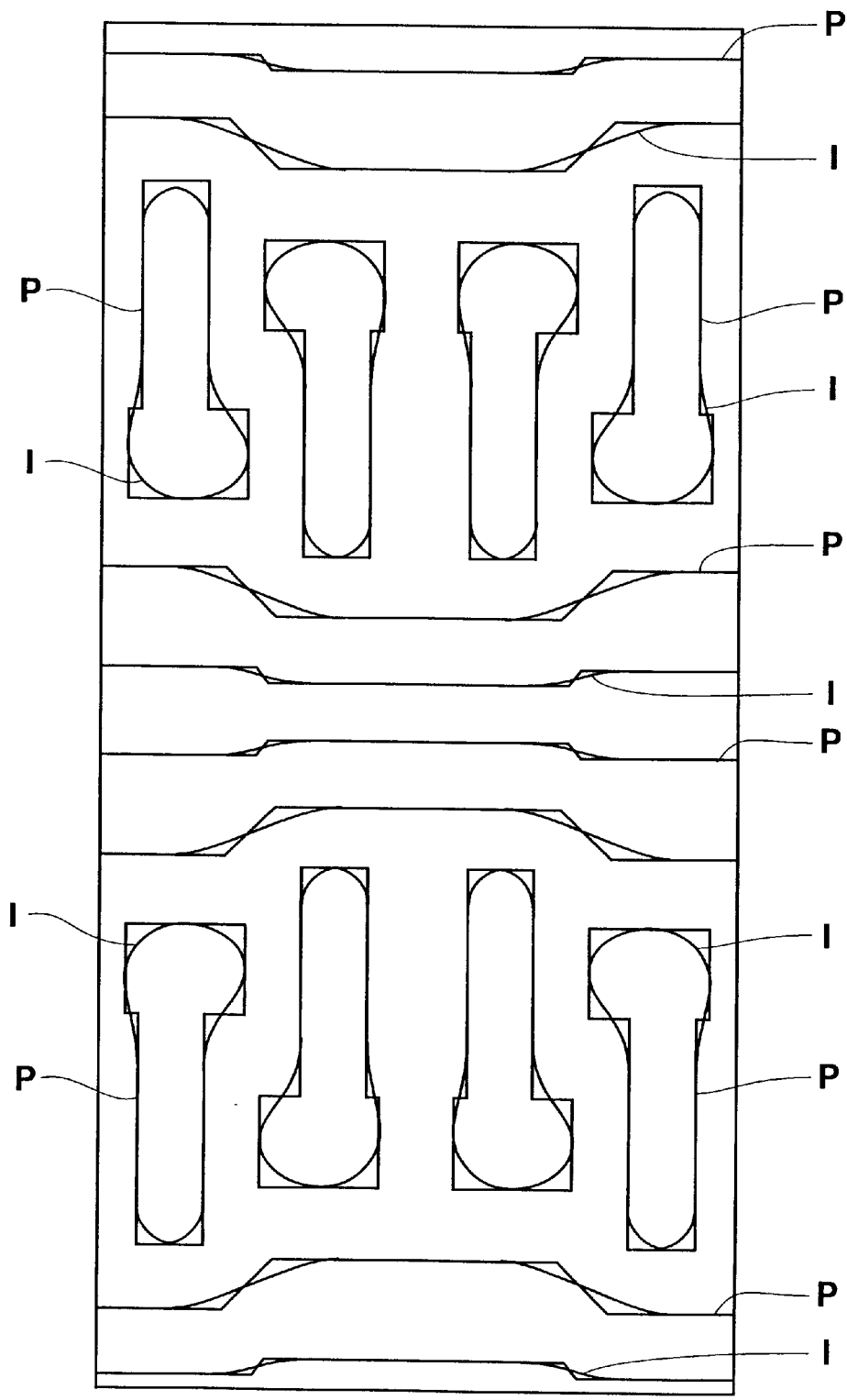
FIG. 37 is an illustration showing a transferred image by the corrected exposure pattern of FIG. 36 in the fourth embodiment.

FIG. 36 shows a corrected exposure pattern obtained by such a computation. By using this pattern as a mask pattern to be formed on the exposure mask, a transferred image I can be formed as shown in FIG. 37. And, with such a correction, the shrinkage of the line end in the design pattern P is reduced more significantly and control of the line width is improved significantly.

Furthermore, the shrinkage of the region where a contact hole is to be formed is also suppressed, enabling superposing of the patterns to be executed more effectively. Since the object exposure pattern is corrected to form an exposure mask such way, designers would be able to form patterns as he/she intends. In addition, the use of such an exposure mask for exposing enables semiconductors excellent in electrical properties to be manufactured with a high production yield.

Subsequently, the fifth embodiment of this invention will be explained. In this embodiment, a polysilicon layer of 0.20 μm rule SRAM is exposed to a light on the conditions (light wave length=248 nm, NA=0.55, and σ=0.60). And, the object correction value is obtained by multiplying the offset at an evaluation point where the transferred image inclination is close to 0 from the design pattern by a specified constant.

In other words, the exposure pattern is corrected as follows in this embodiment so as to obtain a transferred pattern closest possible to the design pattern P shown in FIG.

7. At first, the visible outline of the design pattern P is divided at specified pitches to form a plurality of edges as shown in FIG. 8. Then, a plurality of evaluation points (x marks) are assigned to each of those edges as shown in FIG. 9.

Then, the light intensity distribution when this design pattern P is transferred just in focus by using a mask with this very design pattern is obtained, then a contour line for which the light intensity distribution is sliced with a specified threshold value is found as a transferred image. FIG. 10 shows this transferred image I put on the design pattern P.

After this, at each evaluation point assigned to each edge are found the offset from the position corresponding to each evaluation point of the transferred image I and the inclination of the transferred image I at the position corresponding to each evaluation point. At this time, the direction for measuring the offset of the transferred image I is defined to be vertical to the linear direction of the design pattern P and the direction outward from the design pattern P is defined to be forward.

Here, the offset obtained in correspondence to each evaluation point is defined as E and the inclination of the transferred image I corresponding to each evaluation point is defined as S.

Figure 38:
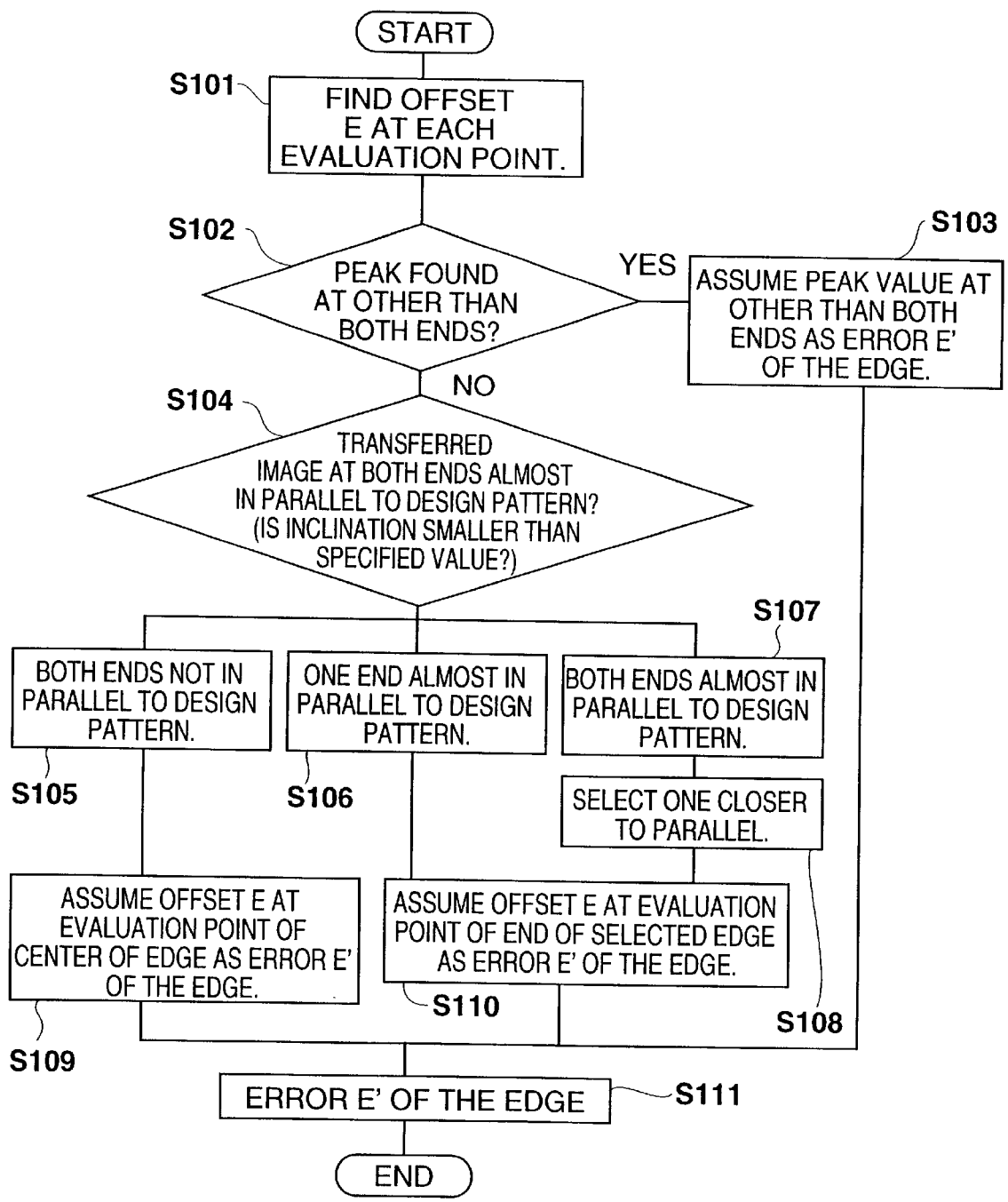
FIG. 38 is a flow chart for determining an error in the fifth embodiment.

Then, an error value E' at each edge is determined from both E and S of the transferred image I obtained as described above as instructed in the flow chart shown in FIG. 38.

In other words, the offset E at each evaluation point is found (in step S101) at first. Then, it is judged whether or not a peak of the transferred image I is found at any evaluation point other than those at both ends of each edge (in step S102). If found, that is, if the transferred image I is convex or concave, the judgment result in step S102 is YES and the offset E at the peak is assumed as an error E' of the edge (in step S103).

On the other hand, if not found, that is, if the transferred image I is neither convex nor concave, the judgment result in step S102 is NO. Thus, it is judged whether or not the transferred image I at both ends is almost parallel to the design pattern P (in step S104).

In step S104, it is judged whether or not the inclination S corresponding to each evaluation point is smaller than the specified value and control goes to one of S105 to S107 according to the judgment result.

For example, the specified value is assumed to be ¼ to compare the inclination S with the specified value. In the case of S>¼, it is judged that both ends of the transferred image I are not in parallel to the design pattern P (in step S105). Thus, the offset E at the evaluation point, which is the center of the edge, is taken as an error E' of the edge (in step S109).

Furthermore, when the inclination S at the evaluation point at one end of the edge becomes S≦¼, one end of the transferred image I is judged to be almost in parallel to the design pattern P (in step S106). The offset E at the evaluation point of the edge end is thus assumed as an error E' of the edge (in step S110).

When the inclination S at each of the evaluation points at both ends of the edge becomes S≦¼, both ends of the transferred image I are judged to be almost in parallel to the design pattern (in step S107). In this case, an evaluation point corresponding to the end that takes the S value closer to 0 is selected (in step S108) and the offset E at the evaluation point is assumed as an error E' of the edge (in step S110).

And, each error E' decided according to the inclination S of the transferred image I such way is assumed as an error E' of the edge (in step S111), ending the error E' decision processing.

After this error E' is decided, the error E' is substituted for the following expression to compute the correction value (bias value B) of the edge. This bias value B is assumed as a correction pattern value added to the object exposure pattern.

$$B = -0.5 \cdot E'$$

In this expression, −0.5 indicates the specified constant and "−" means that biasing is made in the direction opposite to the offset value. "0.5" is a coefficient for adjusting the bias value used for a computation.

After the bias value B is computed by the above expression, the exposure pattern corresponding to each of those edges is moved according to the bias value B to obtain a corrected exposure pattern. After this corrected exposure pattern is obtained, the same computing is repeated as needed while evaluation points are kept at the same positions to obtain the optimized drawing pattern.

FIG. 11 shows a corrected exposure pattern obtained by such a computation. By using this pattern as a mask to form the object exposure pattern, a transferred image I can be formed as shown in FIG. 12. And, with such a correction, the shrinkage of the line end in the design pattern P is reduced more significantly than that of the transferred image I before correction shown in FIG. 10, enabling the control of the line width to be improved significantly.

Furthermore, the shrinkage of the region where a contact hole is to be formed is also suppressed, enabling superposing of the patterns to be executed more effectively. Since the object exposure pattern is corrected to form an exposure mask such way, patterns can be formed as the designer intends. In addition, the use of such an exposure mask for exposing enables semiconductors excellent in electrical properties to be manufactured with a high production yield.

As described above, according to the method of the present invention, unnatural distortion of the transferred image is prevented from being caused by correction of the exposure pattern with an automatic correction in accordance with the purpose of the designers becoming possible. Moreover, no unnecessarily fine correction pattern being added to the exposure pattern suppresses reduction of exposure margin due to degradation in inclination of transferred image intensity. This makes highly precise correction possible without much increasing the number of figures.

What is claimed is:

1. A method of correcting an exposure pattern wherein said exposure pattern is corrected so as to obtain a transferred image closest possible to a desired design pattern in a lithography process in which an object substrate is exposed to a light according to said exposure pattern to transfer said image onto said substrate, said exposure pattern including light transmitting portions having a perimeter that defines the outline of said light transmitting portion, said method comprising the steps of:

dividing the outline of said desired design pattern into a plurality of edges, and further assigning a plurality of evaluation points to each of said edges;

computing a transferred image on said substrate after said substrate has been exposed according to said desired design pattern as the exposure pattern;

computing a distance value between each evaluation point on each of said edges of said desired design pattern and a position corresponding to each of said evaluation points in said transferred image after said substrate has been exposed;

determining a correction value by inputting at least one of said computed distance values into an evaluation function selected from a group of functions consisting of the function $-KEp$ or the function $-K\cdot\Sigma(Ei/Si^2)/\Sigma(1/Si^2)$ where K is a coefficient and the first-mentioned function is selected where a maxima or a minima exists between the ends of a edge and the second mentioned function is selected where the distance values exhibit an inclination relative to the edge; and correcting each edge position of said exposure pattern according to an output value of said evaluation function.

2. A method of correcting an exposure pattern in a lithography process comprising the steps of:

dividing an outline of a desired design pattern into a plurality of edges and further assigning a plurality of evaluation points to each of said edges;

computing a transferred energy intensity on an object substrate when said substrate is exposed to a light according to a desired pattern taken as an exposure pattern; and determining a corrected exposure pattern by inputting said transferred energy intensity to a evaluation function that includes a coefficient, with each of edge positions of said exposure pattern further being corrected according to an output value of said evaluation function.

3. A method of correcting an exposure pattern as defined in claim 2, wherein said evaluation function outputs a sum of products of said transferred energy intensity and said coefficient for a position corresponding to each of said evaluation points in said transferred image.

4. A method of correcting an exposure pattern as defined in claim 3, wherein said coefficient in said evaluation function is set so as to be inversely proportional to an absolute value of a power of an inclination of said transferred energy intensity relative to said exposure pattern at the position corresponding to said evaluation point in said transferred image.

5. A method of correcting an exposure pattern as defined in claim 2, wherein when the maximum or minimum value of said transferred energy intensity is found at a position in said transferred image corresponding to an evaluation point other than those at both ends of a plurality of said evaluation points assigned to one of said edges, said maximum or minimum value is taken as the output value of said evaluation function, and in other cases, the output value of said function is taken as said sum of products of said distance value and said coefficient for each of said evaluation points.

6. A method of correcting an exposure pattern as defined in claim 2, wherein the outline of said desired design pattern is divided at corners formed by said outline.

7. A method of correcting an exposure pattern as defined in claim 2, wherein when the maximum or minimum value of said transferred energy intensity is found at a position in said transferred image corresponding to an evaluation point other than those at both ends of a plurality of said evaluation points assigned to one of said edges, said maximum or minimum value is taken as the input value of said evaluation function.

8. A method of correcting an exposure pattern formed on an exposure mask wherein said exposure pattern is corrected so as to obtain a transferred image closest possible to a desired design pattern in a lithography process in which a substrate is exposed to light according to said exposure pattern to transfer said image onto said substrate, said exposure pattern including light transmitting portions having a perimeter that defines the outline of said light transmitting portion, said method comprising the steps of:

dividing the outline of said desired design pattern into a plurality of edges;

assigning a plurality of evaluation points to each of said edges;

computing a transferred image on said substrate after said substrate has been exposed according to said desired design pattern as the exposure pattern;

computing a distance value between each evaluation point on each of said edges of said desired design pattern and a position corresponding to each of said evaluation points in said transferred image;

evaluating the computed distance values for each edge and identifying those edges in which a maxima or minima is present in the positions corresponding to each of said evaluation points in said transferred image;

determining, for those edges in which a maxima or minima is present in the positions corresponding to each of said evaluation points in said transferred image, a correction value by inputting at least one of said computed distance values into the evaluation function $-KEp$ where K is a predetermined coefficient and Ep is the distance value corresponding to the maxima or minima for those edges in which a maxima or minima is present; and correcting each edge position of said exposure pattern according to the correction output value of said evaluation function.

9. A method of correcting an exposure pattern wherein said exposure pattern is corrected so as to obtain a transferred image closest possible to a desired design pattern in a lithography process in which an object substrate is exposed to light according to said exposure pattern to transfer said image onto said substrate, said exposure pattern including light transmitting portions having a perimeter that defines the outline of said light transmitting portion, said method comprising the steps of:

dividing the outline of said desired design pattern into a plurality of edges;

assigning a plurality of evaluation points to each of said edges;

computing a transferred image on said substrate after said substrate has been exposed according to said desired design pattern as the exposure pattern;

computing a distance value between each evaluation point on each of said edges of said desired design pattern and a position corresponding to each of said evaluation points in said transferred image;

evaluating the computed distance values for each edge and identifying those edges in which the edge and the positions corresponding to the evaluation points in the transferred image are aligned at an inclination S relative to each other;

determining, for those edges aligned at an inclination S, a correction value by inputting a plurality of said computed distance values into the evaluation function $-K\cdot\Sigma(Ei/Si^2)/\Sigma(1/Si^2)$ where K is a predetermined coefficient and E is the distance value; and correcting each edge position of said exposure pattern according to the correction output value of said evaluation function.

10. A method of correcting an exposure pattern wherein said exposure pattern is corrected so as to obtain a transferred image closest possible to a desired design pattern in a lithography process in which an object substrate is exposed to light according to said exposure pattern to transfer said image onto said substrate, said exposure pattern including light transmitting portions having a perimeter that defines the outline of said light transmitting portion, said method comprising the steps of:

dividing the outline of said desired design pattern into a plurality of edges;

assigning a plurality of evaluation points to each of said edges;

computing a transferred image on said substrate after said substrate has been exposed according to said desired design pattern as the exposure pattern;

computing a distance value between each evaluation point on each of said edges of said desired design pattern and a position corresponding to each of said evaluation points in said transferred image;

identifying, by evaluating the computed distance values for each edge, those edges in which a maxima or minima is present in the positions corresponding to each of said evaluation points in said transferred image and those edges in which the edge and the positions corresponding to the evaluation points in the transferred image are aligned at an inclination value S;

determining, for those edges in which a maxima or minima is present in the positions corresponding to each of said evaluation points in said transferred image, a correction value by inputting at least one of said computed distance values into the evaluation function $-KEp$ where K is a predetermined coefficient and Ep is the distance value corresponding to the maxima or minima for those edges in which a maxima or minima is present;

determining, for those edges aligned at an inclination S, a correction value by inputting a plurality of said computed distance values into the evaluation function $-K \cdot \Sigma (Ei/Si^2)/\Sigma(1/Si^2)$ where K is a predetermined coefficient and E is the distance value; and correcting each edge position of said exposure pattern according to the correction output value of said selected evaluation functions.

\* \* \* \* \*